(12) United States Patent
Kruglick

(10) Patent No.: US 9,500,392 B2
(45) Date of Patent: Nov. 22, 2016

(54) MULTISTAGE THERMAL FLOW DEVICE AND THERMAL ENERGY TRANSFER

(75) Inventor: Ezekiel Kruglick, Poway, CA (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 30 days.

(21) Appl. No.: 13/813,588

(22) PCT Filed: Jul. 17, 2012

(86) PCT No.: PCT/US2012/047013
§ 371 (c)(1),
(2), (4) Date: Jan. 31, 2013

(87) PCT Pub. No.: WO2014/014448
PCT Pub. Date: Jan. 23, 2014

(65) Prior Publication Data
US 2014/0020405 A1 Jan. 23, 2014

(51) Int. Cl.
*F25B 21/00* (2006.01)
*F25B 21/02* (2006.01)
*F25B 21/04* (2006.01)
(Continued)

(52) U.S. Cl.
CPC ............... *F25B 21/02* (2013.01); *F25B 21/00* (2013.01); *F25B 21/04* (2013.01); *F25B 2321/001* (2013.01); *H01L 35/00* (2013.01); *H01L 35/02* (2013.01); *H01L 35/34* (2013.01); *Y02B 30/66* (2013.01)

(58) Field of Classification Search
CPC ........ F25B 21/00; F25B 21/02; F25B 21/04; H01L 35/00; H01L 35/02; H01L 35/34

USPC .............................................. 62/3.1, 3.2, 3.3
See application file for complete search history.

(56) References Cited

U.S. PATENT DOCUMENTS 2,978,875 A 4/1961 Lackey et al.
4,673,030 A 6/1987 Basiulis
(Continued)

FOREIGN PATENT DOCUMENTS

CN 86 1 01652 A 11/1986
CN 1237791 A 12/1999
(Continued)

OTHER PUBLICATIONS

U.S. Office Action dated Mar. 16, 2012 in U.S. Appl. No. 12/999,684.
(Continued)

*Primary Examiner* — Marc Norman
*Assistant Examiner* — David Teitelbaum
(74) *Attorney, Agent, or Firm* — Maschoff Brennan

(57) ABSTRACT

Technologies are generally described herein for multistage thermal flow devices and methods effective to transfer thermal energy between a heat source and a heat sink having different surface areas and thermal energy flow characteristics. Some example multistage thermal flow devices may include multiple stages of heat transfer pumps utilizing electrocaloric effect material with thermal collection devices between stages. The heat flux associated with heat transfer pumps of consecutive stages may increase to concentrate the thermal energy through the multistage thermal flow device or may decrease to diffuse the thermal energy through the multistage thermal flow device.

16 Claims, 8 Drawing Sheets

(51) Int. Cl.
  *H01L 35/00* (2006.01)
  *H01L 35/02* (2006.01)
  *H01L 35/34* (2006.01)

(56) References Cited

U.S. PATENT DOCUMENTS

| | | | |
|---|---|---|---|
| 4,757,688 | A | 7/1988 | Basiulis et al. |
| 4,860,748 | A | 8/1989 | Chiurco et al. |
| 4,929,516 | A | 5/1990 | Pryor et al. |
| 5,040,381 | A | 8/1991 | Hazen |
| 5,229,566 | A | 7/1993 | Alexandres |
| 5,515,238 | A | 5/1996 | Fritz et al. |
| 5,690,849 | A | 11/1997 | De Vilbiss et al. |
| 6,105,381 | A | 8/2000 | Ghoshal |
| 6,285,079 | B1 | 9/2001 | Kunikiyo |
| 6,300,150 | B1 | 10/2001 | Venkatasubramanian |
| 6,556,752 | B2 | 4/2003 | Fang et al. |
| 6,588,215 | B1 | 7/2003 | Ghoshal |
| 6,711,904 | B1 | 3/2004 | Law et al. |
| 6,877,325 | B1 | 4/2005 | Lawless |
| 7,293,416 | B2 | 11/2007 | Ghoshal |
| 7,305,839 | B2 | 12/2007 | Weaver, Jr. |
| 7,421,845 | B2 | 9/2008 | Bell |
| 7,475,551 | B2 | 1/2009 | Ghoshal |
| 7,900,450 | B2 | 3/2011 | Gurin |
| 7,951,467 | B2 | 5/2011 | Tsushima |
| 8,869,541 | B2 | 10/2014 | Heitzler et al. |
| 2001/0023591 | A1 | 9/2001 | Maeda et al. |
| 2003/0033818 | A1* | 2/2003 | Kucherov et al. ............... 62/3.1 |
| 2005/0045702 | A1 | 3/2005 | Freeman et al. |
| 2005/0086948 | A1 | 4/2005 | Milke-Rojo et al. |
| 2005/0109041 | A1 | 5/2005 | Tanaka |
| 2005/0269065 | A1 | 12/2005 | Chen |
| 2006/0092694 | A1 | 5/2006 | Choi et al. |
| 2006/0137359 | A1 | 6/2006 | Ghoshal |
| 2006/0139116 | A1 | 6/2006 | Niki et al. |
| 2006/0201161 | A1 | 9/2006 | Hirai et al. |
| 2007/0007613 | A1 | 1/2007 | Wang et al. |
| 2008/0303375 | A1 | 12/2008 | Carver |
| 2009/0139244 | A1 | 6/2009 | Ullo et al. |
| 2009/0258248 | A1 | 10/2009 | Tsushima |
| 2009/0293499 | A1 | 12/2009 | Bell et al. |
| 2009/0301541 | A1 | 12/2009 | Watts |
| 2009/0308081 | A1 | 12/2009 | Ouyang et al. |
| 2010/0037624 | A1 | 2/2010 | Epstein et al. |
| 2010/0096113 | A1 | 4/2010 | Varanasi et al. |
| 2010/0140772 | A1 | 6/2010 | Lin et al. |
| 2010/0175392 | A1 | 7/2010 | Malloy et al. |
| 2010/0212327 | A1 | 8/2010 | Barve et al. |
| 2010/0218511 | A1* | 9/2010 | Rockenfeller ................ 62/3.1 |
| 2010/0230653 | A1 | 9/2010 | Chen |
| 2010/0236258 | A1 | 9/2010 | Heitzler et al. |
| 2011/0016885 | A1 | 1/2011 | Zhang et al. |
| 2011/0063904 | A1 | 3/2011 | Chang et al. |
| 2011/0113791 | A1 | 5/2011 | Kruglick |
| 2011/0146308 | A1* | 6/2011 | Casasanta ..................... 62/113 |
| 2011/0203839 | A1 | 8/2011 | Iwamoto |
| 2011/0309463 | A1 | 12/2011 | Kruglick |
| 2012/0055174 | A1 | 3/2012 | Kruglick |
| 2012/0267090 | A1 | 10/2012 | Kruglick |
| 2013/0067934 | A1 | 3/2013 | Kruglick |
| 2013/0067935 | A1 | 3/2013 | Kruglick |

FOREIGN PATENT DOCUMENTS

| | | |
|---|---|---|
| CN | 1992358 A | 7/2007 |
| CN | 2932237 A | 8/2007 |
| CN | 101246947 A | 8/2008 |
| CN | 101291769 A | 10/2008 |
| CN | 101587934 A | 11/2009 |
| CN | 101842647 A | 9/2010 |
| EP | 0 194 475 A2 | 9/1986 |
| GB | 2420662 | 5/2006 |
| JP | H11177151 A | 7/1999 |
| WO | 2006056809 A1 | 6/2006 |
| WO | 2008137940 A1 | 11/2008 |
| WO | 2009126344 A2 | 10/2009 |

OTHER PUBLICATIONS

U.S. Office Action dated Aug. 2, 2012 in U.S. Appl. No. 12/999,684.
International Search Report & Written Opinion dated Aug. 11, 2010 in PCT Application No. PCT/US10/39200.
International Search Report & Written Opinion dated Jun. 4, 2011 in PCT Application No. PCT/US11/33220.
International Search Report & Written Opinion dated Dec. 20, 2011 in PCT Application No. PCT/US11/52569.
International Search Report & Written Opinion dated Dec. 21, 2011 in PCT Application No. PCT/US11/52577.
International Search Report & Written Opinion dated Nov. 12, 2010 in PCT Application No. PCT/US10/47887.
International Search Report & Written Opinion dated Oct. 15, 2012 in PCT Application No. PCT/US12/47013.
Akcay, G. et al., "Influence of mechanical boundary conditions on the electrocaloric properties of ferroelectric thin films," Journal of Applied Physics 103 (2008).
Ashley, S., "Cool Polymers: Toward the Microwave Over Version of the Refrigerator," Scientific America Magazine Printed Apr. 7, 2009 [http://www.sciam.com/article.cfm?id=cool-polymers&print=true].
Arik, Mehmet, "Enhancement of Pool Boiling Critical Heat Flux in Dielectric Liquids," Doctoral Dissertation submitted to University of Minnesota, Feb. 2001.
Arik, Mehmet, "Enhancement of Pool Boiling Critical Heat Flux in Dielectric Liquids by Microporous Coatings," International Journal of Heat and Mass Transfer, 2007, pp. 997-1009, vol. 50.
Dames, C., "Solid-State Thermal Rectification with Existing Bulk Materials," Journal of Heat Transfer 131, No. 6 (2009).
Epstein, R.I., "Photonic and Electronic Cooling," International Conference on Emerging Trends in Electronic and Photonic Devices & Systems, ELECTRO '09, Dec. 2009.
Fett, T. et al., "Nonsymmetry in the Deformation Behaviour of PZT," Journal of Materials Science Letters 17, No. 4, (1998) (Abstract only).
Kobayashi, et al., "An Oxide Thermal Rectifier"; http://arxiv.org/abs/0910.1153; Oct. 7, 2009.
Li et al., "Interface Thermal Resistance Between Dissimilar Anharmonic Lattices"; Physics Review Letters, vol. 95, 104302 (2005).
Mischenko, A. et al., "Giant Electrocaloric Effect in Thin-Film PPbZr0.95Ti0.05O3" Science, vol. 311 Downloaded Oct. 21, 2009 [www.sciencemag.org] Aug. 8, 2008, pp. 821-823.
Morita et al., "Ferroelectric Properties of an Epitaxial Lead Zirconate Titanate Thin Film Deposited by a Hydrothermal Method Below the Curie Temperature"; Applied Physics Letters, vol. 84, No. 25, Jun. 21, 2004.
Neese, B. et al., "Large Electrocaloric Effect in Ferroelectric Polymers Near Room Temperature," Science 321, No. 5890, (2008) (Abstract only).
Peyrard, M., "The Design of a Thermal Rectifier"; Europhysics Letters vol. 76, No. 49; (2006).
Salam, et al., "Pressure Drop Measurements in a Low Pressure Steam Condenser with a Horizontal Bundle of Staggered Tubes," Applied Thermal Engineering, 2004, pp. 1365-1379, vol. 24.
Seim, H. et al., "Growth of LaCoO3 Thin Films from β-diketonate precursors," Applied Surface Science, vol. 112, 1997 pp. 243-250.
Takeshi M., et al., "Ferroelectric properties of an epitaxial lead zirconate titanate thin film deposited by a hydrothermal method below the Curie temperature," Applied Physics Letters, vol. 84, Issue: 25, Jun. 21, 2004, pp. 5094-5096.
Terraneo et al., "Controlling the Energy Flow in Nonlinear Lattices: A Model for a Thermal Rectifier"; Physical Review Letters, vol. 88, No. 9, Mar. 4, 2002.
Waller, D. et al., "The effect of pulse duration and oxygen partial pressure on La0.7Sr0.3CoO3- and La0.7Sr0.3Co0.2Fe0.8O3-films prepared by laser ablation," Solid State Ionics, vol. 134, No. 1, Oct. 1, 2000, pp. 119-125(7).

(56) References Cited

OTHER PUBLICATIONS

"Heat Diode Paves the Way for Thermal Computing," Technology Review, accessed at [http://www.technologyreview.com/blog/arxiv/24222/?a=f] Oct. 2009.
McNeil, D.A., "Pressure Drop and Heat Transfer Distributions Around a Bundle of Plasma-Treated Tubes Condensing Dropwise," Department of Mechanical and Chemical Engineering, Heriot-Watt University, Dec. 1999.
U.S. Appl. No. 13/386,736, filed Jan. 24, 2012.
U.S. Appl. No. 13/384,859, filed Jan. 19, 2012.
U.S. Notice of Allowance dated Jan. 27, 2014 in U.S. Appl. No. 13/386,736.
U.S. Notice of Allowance dated Jan. 30, 2014 in U.S. Appl. No. 12/999,182.
Surana, R., "High Strain Functionally Graded Barium Titanate and its Mathematical Characterization," A dissertation submitted to the Division of Research and Advanced Studies of the University of Cincinnati, Sep. 27, 2004, pp. 1-104.
Lankford, K., "Spacecraft Thermal Control Handbook," Chapter 10, Heat Switches, 2002, pp. 353-371.
Sharpe, W.N. Jr. and Sharpe, W. I., "Springer Handbook of Experimental Solid Mechanics," Atomic Force Microscopy in Solid Mechanics, Part B, Chapter 17.2.5 PZT Actuator Nonlinearities, Dec. 4, 2008, pp. 420-423 (http://tinyurl.com/2bg6zkt).
U.S. Official Action dated Nov. 7, 2013 in U.S. Appl. No. 13/384,859.
U.S. Official Action dated Nov. 21, 2013 in U.S. Appl. No. 13/145,948.
U.S. Official Action dated Sep. 12, 2013 in U.S. Appl. No. 13/386,736.
Vereshchagina, Elizaveta, "Investigation of Solid-State Cooler Based on Electrocaloric Effect," MS Thesis, 2007.
Sebald, G. et al., "Pyroelectric Energy Conversion: Optimization Principles," IEEE Transactions on Ultrasonics, Ferroelectrics, and Frequency Control, vol. 55, No. 3, Mar. 2008.
"Thermal Analysis of Semiconductor Systems," White Paper, Freescale Semiconductor, Inc., accessed at http://www.freescale.com/files/analog/doc/white_paper/BasicThermalWP.pdf, pp. 24 (2008).
International Search Report and Written Opinion for International Application No. PCT/US2012/055872 mailed on Nov. 20, 2012.
Kim, S.B., et al., "Thermal disturbance and its impact on reliability of phase-change memory studied by the micro-thermal stage," IEEE International Reliability Physics Symposium (IRPS), pp. 99-103 (2010).
Lencer, D., et al., "Design Rules for Phase-Change Materials in Data Storage Applications," Advanced Materials, vol. 23, No. 18, pp. 2030-2058 (May 10, 2011).
Servalli, G., "A 45nm Generation Phase Change Memory Technology," IEEE International Electron Devices Meeting, pp. 1-4 (Dec. 7-9, 2009).
Sinyavskii, Y. V., "Electrocaloric Refrigerators: A Promising Alternative to Current Low-Temperature Apparatus," Chemical and Petroleum Engineering, vol. 31, No. 6, p. 295-306 (Jan. 1, 1995).
Supplementary European search report for EP2583320 mailed on dated Jan. 2, 2014.
Chinese First Office Action dated Apr. 7, 2015 as received in Application No. 201180073606.2.
Chinese First Office Action dated Apr. 9, 2015 as received in Application No. 201180073616.6.
"Thermal Analysis of Semiconductor Systems," White Paper, Freescale Semiconductor, Inc., accessed at https://web.archive.org/web/20130906091350/http://cache.freescale.com/files/analog/doc/white_paper/BasicThermalWP.pdf, accessed on Feb. 24, 2015, pp. 1-24.
International Preliminary Report on Patentability for PCT application No. PCT/US2010/039200 mailed on Dec. 19, 2012.
International Preliminary Report on Patentability for PCT application No. PCT/US2010/047887 mailed on Mar. 5, 2013.
International Preliminary Report on Patentability for PCT application No. PCT/US2011/052569 mailed on Mar. 25, 2014.
International Preliminary Report on Patentability for PCT application No. PCT/US2011/033220 mailed on Oct. 22, 2013.
International Preliminary Report on Patentability for PCT application No. PCT/US2011/052577 mailed on Mar. 25, 2014.
International Preliminary Report on Patentability for PCT application No. PCT/US2012/047013 mailed on Jan. 20, 2015.
Bai et al, Direct measurement of Giant Electrocaloric Effect in BaTiO3 Multilayer Thick Film Structure Beyond Theoreticlal Prediction, 2010 Applied Physics Letters 96, 3pp.
Epstein et al., Electrocaloric Devices Based on Thin-Film Heat Switches, 2009 Journal of Applied Physics 106, 7pp.

* cited by examiner

MULTISTAGE THERMAL FLOW DEVICE AND THERMAL ENERGY TRANSFER

CROSS-REFERENCE TO RELATED APPLICATIONS

This application is a U.S. National Stage filing under 35 U.S.C. §371 of international application serial number PCT/US2012/047013, filed Jul. 17, 2012. This application is related to co-pending application serial number PCT/US2010/039200, entitled, "Electrocaloric Effect Materials and Thermal Diodes," filed on 18 Jun. 2010, corresponding U.S. National Stage filing, application Ser. No. 12/999,684, entitled "Electrocaloric Effect Materials and Thermal Diodes," filed on 17 Dec. 2010, and to co-pending application serial number PCT/US2011/033220, entitled, "Heterogeneous Electrocaloric Effect Heat Transfer Device," filed on 20 Apr. 2011, and corresponding U.S. National Phase filing, U.S. application Ser. No. 13/145,948, entitled "Heterogeneous Electrocaloric Effect Heat Transfer Device," filed on 22 Jul. 2011, each of which is herein incorporated by reference in its entirety.

BACKGROUND

Unless otherwise indicated herein, the materials described in this section are not prior art to the claims in this application and are not admitted to be prior art by inclusion in this section.

Electrocaloric effect materials are materials that can experience a temperature change when subjected to an applied voltage. This temperature change can be reversed upon the removal of the applied voltage. By physically coupling and decoupling electrocaloric effect material to and from a heat source, thermal energy can be dynamically transferred in quantities that are greater in one direction than the other. The described principles may be applied to a heat transfer device that can be utilized to transfer thermal energy away from a heat source.

The present disclosure appreciates that heat transfer devices utilizing electrocaloric effect materials may experience various performance limitations. Specifically, a heat transfer device utilizing conventional electrocaloric effect materials may experience a limited ability to concentrate thermal energy transferred away from a heat source. This performance limitation results from the configuration of a conventional heat transfer device that provides a fixed heat flux through the heat transfer device.

Heat flux may be described as the rate of thermal energy transfer per unit area of material through which the thermal energy is transferred. A heat transfer device may be configured to provide a particular heat flux depending on a number of factors, including but not limited to, the electrocaloric effect material characteristics of the electrocaloric effect material layers, thermal rectifier characteristics of the thermal rectifier layers, and the characteristics of the applied electrode control signal provided to activate the transfer of thermal energy through the heat transfer device. Irrespective of the heat flux designed for any particular heat transfer device, the heat flux is fixed across the length of that device, meaning the heat flux at the side of the device in thermal contact with a heat source is the same as the heat flux at the side of the device in thermal contact with a heat sink.

Heat pump applications exist in which it may be desirable to remove thermal energy from a heat source having a first surface area and heat flux and providing the thermal energy to a heat sink having a second surface area and heat flux that differs substantially from the first surface area and heat flux of the heat source. As an example, a refrigerator utilizes cooling coils that cool by removing heat at a low rate over a large space. Temperature changes within a refrigerator may be relatively mild. Accordingly, the heat flux associated with the cooling process may be low and spread over a large surface area. In contrast, a stove heats a burner very rapidly. The heat flux is high and is concentrated on a relatively small surface area. Although it may be desirable to utilize a heat transfer device that removes the thermal energy from the refrigerator and transfers that thermal energy to the stove to heat the burner, conventional heat transfer devices utilizing electrocaloric effect materials may not directly perform this function due to the fixed heat flux of the heat transfer device. If a heat transfer device having a high heat flux is utilized in this example, thermal energy would be transferred from too small of a space and at too high of a rate for continued operation of the refrigerator. If a heat transfer device having a low heat flux is utilized, thermal energy would be transferred too slowly over too large of an area to effectively heat the stove burner.

SUMMARY

The present disclosure generally describes techniques for multistage thermal flow devices and methods that may be effective to utilize multistage thermal flow devices to concentrate or diffuse thermal energy from a heat source. According to some example embodiments, a multistage thermal flow device may include a source stage and a target stage. The source stage may include a heat transfer pump with an input interface that thermally couples to a heat source, an output interface that provides thermal energy from the input interface, electrocaloric effect material, and a heat flux. The source stage may additionally include a thermal collection device thermally coupled to the output interface of the heat transfer pump. The target stage may include heat transfer pump with an input interface thermally coupled to the thermal collection device, an output interface for providing thermal energy from the thermal collection device to a heat sink, electrocaloric effect material, and a heat flux that is different than the heat flux associated with the source stage.

The present disclosure also generally describes methods that may be employed to transfer thermal energy between a heat source and heat sink. Some example methods may include applying an electric field across an electrocaloric effect material of a heat transfer pump of a source stage that is in thermal contact with a heat source. During the application of the electric field, thermal energy can be transferred from the heat source through the heat transfer pump of the source stage to a thermal collection device of the source stage according to a heat flux. A second electric field may be applied across an electrocaloric effect material of a heat transfer pump of a target stage that is in thermal contact with a thermal collection device of the source stage. During application of the second electric field, thermal energy can be transferred from the thermal collection device through the heat transfer pump of the target stage to a heat sink according to a heat flux that is different than the heat flux associated with the transfer of thermal energy through the source stage.

The present disclosure further generally describes a multistage thermal flow concentration device. According to some example embodiments, a multistage thermal flow concentration device may include a number of heat transfer pumps of a source stage, a thermal collection device thermally coupled to the heat transfer pumps of the source stage, and at least one heat transfer pump of a target stage thermally coupled to the thermal collection device. Each heat transfer pump of the source stage may have an electrocaloric effect material and a heat flux. The heat transfer pumps may be configured to transfer thermal energy from a heat source to the thermal collection device according to the heat flux. The heat transfer pump of the target stage may be thermally coupled to the thermal collection device of the source stage and have an electrocaloric effect material and a heat flux that is greater than the heat flux associated with the source stage. The heat transfer pump of the target stage may be thermally coupled to a heat sink and may be configured to transfer the thermal energy from the thermal collection device to the heat sink according to the heat flux of the target stage.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
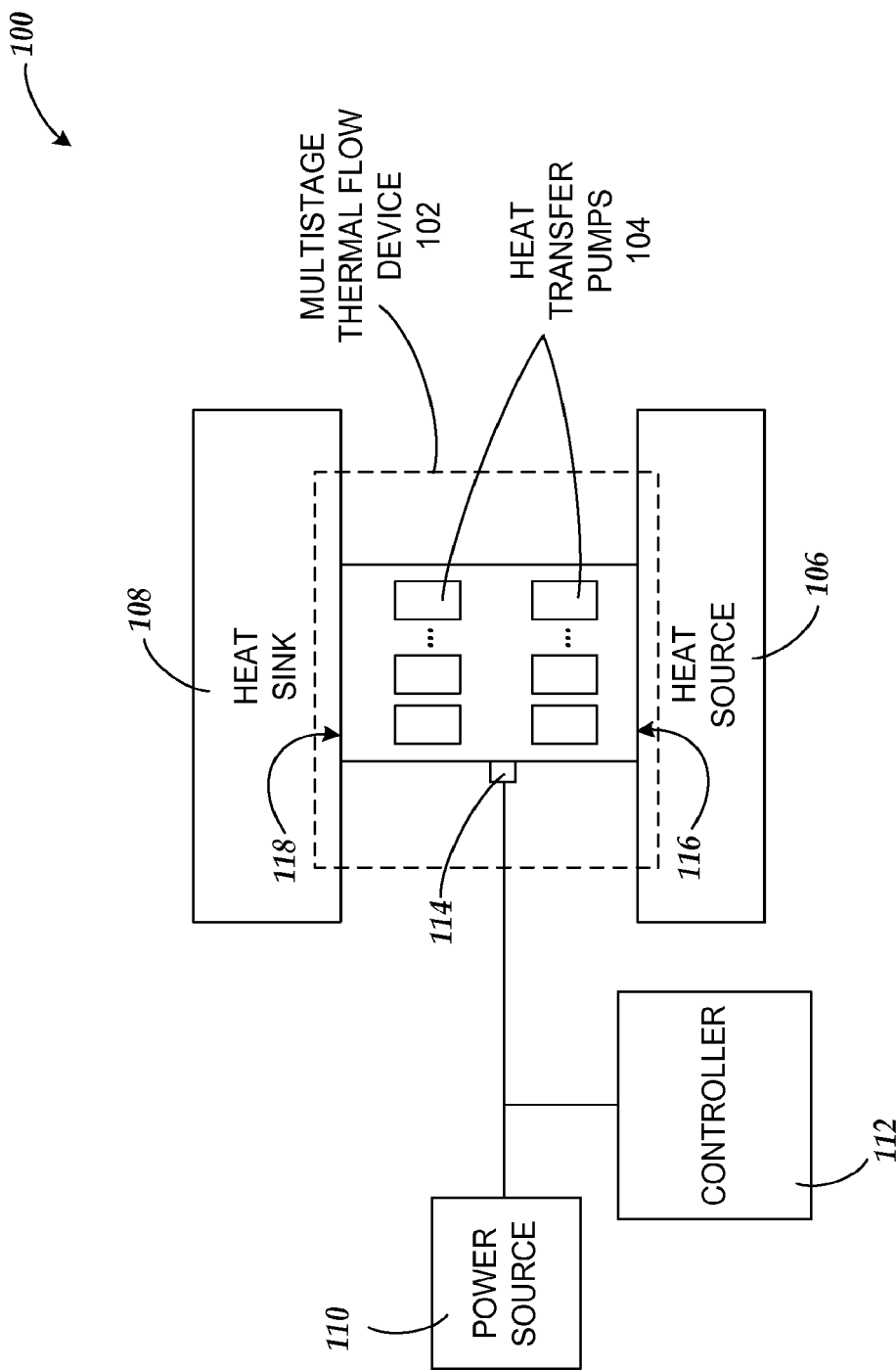
FIG. 1 is a functional block diagram illustrating an example electrocaloric effect heat transfer system utilizing a multi stage thermal flow device having a number of heat transfer pumps.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to electrocaloric effect heat transfer techniques that can utilize a multistage heat pump configuration effective to transfer thermal energy away from a heat source according to a first heat flux and to a heat sink according to a second heat flux.

As discussed above, conventional heat pumps that utilize electrocaloric effect material may be effective in transferring thermal energy from a heat source to a heat sink. However, due to the design characteristics of an electrocaloric effect material heat pump, the heat flux typically remains fixed throughout the device. Another way of stating this concept is that the thermal impedance of an electrocaloric effect material heat pump is typically equivalent at both the input side and the output side of the heat transfer pumps located within the heat pump device. The rate at which thermal energy can be transferred through a given surface area may not be increased or decreased as thermal energy is transferred from a heat source at the entry side of the pump to a heat sink at the exit side of the stack. For these reasons, conventional electrocaloric effect material heat pumps may not be used to concentrate or diffuse the thermal energy that is transferred from a heat source.

In some illustrative implementations described herein, a multistage thermal flow device may be configured to utilize multiple stages of heat transfer pumps. Each stage may include a number of heat transfer pumps that are each capable of pulling thermal energy away from a surface area of a heat source at a desirable rate. These heat transfer pumps may individually transfer thermal energy from the heat source into one or more thermal collection devices. Each thermal collection device may be thermally coupled to a desired number of heat transfer pumps configured to aggregate the thermal energy from multiple heat transfer pumps. Subsequent stages of heat transfer pumps and thermal collection devices may be similarly "stacked" or coupled above the source stage that is coupled to the heat source. Each subsequent stage may include heat transfer pumps having a different heat flux than the heat transfer pumps of the source stage. In this manner, thermal energy may be removed from a heat source having any surface area at any desired rate and delivered to a heat sink having a different surface area at a different rate.

FIG. 1 is a functional block diagram illustrating an example electrocaloric effect heat transfer system 100 utilizing a multistage thermal flow device 102 having a number of heat transfer pumps 104, arranged in accordance with at least some embodiments described herein. The heat transfer pumps 104 will be described in greater detail below with respect to FIG. 2. Various example configurations of a multistage thermal flow device 102 and the corresponding heat transfer pumps 104 will be described with respect to FIGS. 3-6.

One surface 116 of the multistage thermal flow device 102 may be thermally coupled to a heat source 106 to be cooled. An opposing surface 118 of the multistage thermal flow device 102 may be thermally coupled to a heat sink 108, which receives heat transferred from the heat source 106 by the multistage thermal flow device 102. The thermal coupling may include direct surface-to-surface contact between the multistage thermal flow device 102 and the heat source 106, as well as between the multistage thermal flow device 102 and the heat sink 108, with or without a physical connection or coupling of the components. Alternatively, any other intervening components may be utilized to thermally couple the multistage thermal flow device 102 to the heat source 106 and to the heat sink 108, provided that the intervening components provide a thermally conductive path that facilitates heat transfer between the components of the electrocaloric effect heat transfer system 100. Other example intervening components may include, but are not limited to, thermal grease or paste, thermally conductive adhesives and adhesive tapes, thermally conductive shims, and solder.

The multistage thermal flow device 102 can be electrically coupled to a power source 110 via one or more electrodes 114. It should be appreciated that although the electrodes 114 are represented in FIG. 1 as a single box or rectangle, implementations may include any number and type of electrodes 114 positioned appropriately throughout the multistage thermal flow device 102, each being operable to subject the various electrocaloric effect material layers of the heat transfer pumps 104 to electrical fields provided by the power source 110. For example, as will be described in further detail below with respect to FIG. 2, each heat transfer pump 104 may include alternating layers of electrocaloric effect material and thermal rectifier material. According to one implementation, two electrodes 114 may be positioned on opposing sides of the electrocaloric effect material layer, optionally encompassing an adjacent thermal rectifier layer. Example electrodes 114 are further described and illustrated in application serial number PCT/US2010/039200, entitled, "Electrocaloric Effect Materials and Thermal Diodes," filed on 18 Jun. 2010, and corresponding U.S. National Phase filing, U.S. application Ser. No. 12/999,684, entitled "Electrocaloric Effect Materials and Thermal Diodes," filed on 17 Dec. 2010, each of which is herein incorporated by reference in its entirety.

In some examples, an electrode control signal may be applied to the electrodes 114 from the power source 110 effective to generate an electric field across the associated electrocaloric effect material. The electrode control signal may be any type of signal that is effective to produce the desired temperature change within the electrocaloric effect material and corresponding heat pumping action that transfers heat away from the heat source 106.

According to one example implementation, the electrode control signal may be an oscillating voltage. The oscillating voltage may be provided as any of a variety of voltage waveforms. In some examples, the oscillating voltage may be provided as a pulsed signal with a direct current (DC) voltage of specified amplitude that is pulsed on or off (or simply between an upper voltage and lower voltage) with a specified duty cycle and period. In some additional examples, the oscillating voltage may be provided as a sinusoidal signal with an alternating current (AC) voltage of a specified amplitude, frequency, phase and/or DC offset. In still additional examples, the oscillating voltage may be provided as a ramped or sawtooth signal with a specified amplitude, rate, period and/or DC offset. In still other examples, the oscillating voltage may be provided as a triangular signal with a specified amplitude, first ramp rate (e.g., increasing), second ramp rate (e.g., decreasing), period, and/or DC offset. Additional waveforms or combinations of waveforms are also contemplated.

The electrocaloric effect heat transfer system 100 may include a controller 112 that is operative to control the electrode control signal applied to the electrodes 114 from the power source 110 to create the desired electric fields that drive the transfer of thermal energy through the system. The controller 112 may include any type of computer hardware and/or software capable of providing the electrode control signal at the desired waveform characteristics according to, inter alia, the electrocaloric effect material used. The controller 112 may be included as part of the multistage thermal flow device 102, or may be an external component of the electrocaloric effect heat transfer system 100 as shown in FIG. 1. The controller 112, as arranged in accordance with at least some embodiments will be described in greater detail below with respect to FIG. 8.

It should be appreciated that the heat source 106 may be any electronic component, computer component, appliance, or any device that may generate or absorb heat during operation. Similarly, the heat sink 108 may include any thermally conductive material such as silicon or a metal or metal alloy heat sink material. In some examples, the heat sink 108 may be comprised of one or more heating elements of an appliance such as a stove burner, oven, or furnace. Example thermally conductive materials may include, but are not limited to, aluminum, copper, silver, gold, platinum, tungsten, and other metal or metal alloys. Although less thermally conductive than the metal and metal alloys described above, other materials that are suitable for high temperatures, such as ceramics, are also contemplated.

Figure 2:
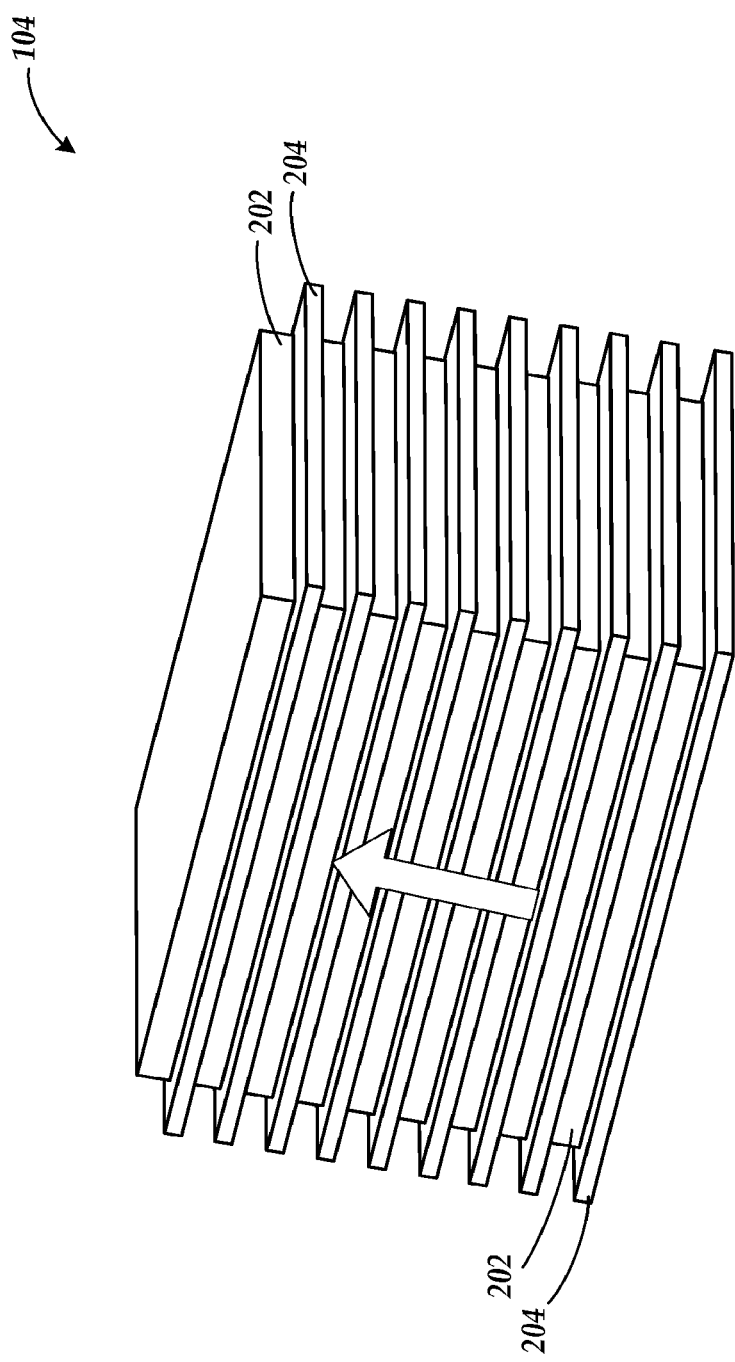
FIG. 2 is a perspective view of an example heat transfer pump of an electrocaloric effect heat transfer system.

FIG. 2 is a perspective view of an example heat transfer pump 104 of an electrocaloric effect heat transfer system 100, arranged in accordance with at least some embodiments described herein. According to this example, the heat transfer pump 104 may include alternating layers of electrocaloric effect material 202 and thermal rectifier material 204. A layer of thermal rectifier material 204 may be positioned between the heat source 106 or thermal collection device (shown and described below with respect to FIGS. 3-6) and the first layer of electrocaloric effect material 202. A first surface of the thermal rectifier material 204 may be configured to abut a surface of the heat source 106 or thermal collection device, and an opposing second surface of the thermal rectifier material 204 may be configured to abut a surface of the first layer of electrocaloric effect material 202.

In this manner, the first layer of electrocaloric effect material 202 is arranged in indirect thermal contact with the heat source 106 or thermal collection device, and arranged in direct thermal contact with the thermal rectifier material 204. Alternatively, it should be appreciated that any thermally conductive compound may intervene between the first layer of electrocaloric effect material 202 and the heat source 106 or thermal collection device, between the first layer of thermal rectifier material 204 and the heat source 106 or thermal collection device, or between the first layer of thermal rectifier material 204 and the first layer of electrocaloric effect material 202. Examples of thermal conductive compounds may include, but are not limited to, a silver gel compound, copper plate, thermal grease or paste, thermally conductive adhesives and adhesive tapes, solder, and/or any type of thermally conductive shim. As an oscillating voltage or other electrode control signal is supplied to the layers of electrocaloric effect material 202, thermal energy can be transferred away from the heat source 106 or thermal collection device and through the layers of the heat transfer pump 104.

The electrocaloric effect material 202 may include any suitable electrocaloric effect material that may experience a temperature change upon an application of an applied voltage. The electrocaloric effect material 202 may be substantially homogenous throughout the various layers of a single heat transfer pump 104 in that each layer may include the same characteristics, including but not limited to the type of electrocaloric effect material, as well as the layer dimensions and shape of the material. Alternatively, the electrocaloric effect material 202 layers may differ in any characteristics within a single heat transfer pump 104.

The thermal rectifier material 204, or thermal diode, may have an asymmetrical thermal conductance characteristic, in that heat may be transported more readily in one general direction than in another, as indicated by the open arrow in FIG. 2. Another way of stating the heat transfer characteristic of the thermal rectifier material 204 is that the thermal rectifier material 204 may be configured to resist heat transfer in a direction from the heat sink 108 to the heat source 106 after removal of the electric field from the corresponding heat transfer pump 104. Although for clarity purposes, each layer of the thermal rectifier material 204 is illustrated as a uniform sheet, it should be appreciated that according to various implementations, the thermal rectifier material 204 may include any quantity of suitable materials having different temperature coefficients of thermal conductivity. The materials having different temperature coefficients of thermal conductivity may be configured in thermal contact with one another, or may utilize heat pipes, actuators, or any other implementation that allows heat to more readily flow in one direction than the other. The thermal rectifier material 204 characteristics may be substantially homogenous throughout the various layers of a single heat transfer pump 104 in that each thermal rectifier layer may include the same characteristics as other thermal rectifier layers, including but not limited to the type of thermal rectifier material, as well as the layer dimensions and shape. Alternatively, the thermal rectifier material 204 layers may differ in any characteristics within a single heat transfer pump 104.

The precise characteristics of a single heat transfer pump 104 may vary according to the desired heat pump performance for the particular implementation. For example, the electrocaloric effect material 202, the materials used within the thermal rectifier material 204, the positioning of the electrodes 114 and corresponding voltage application, and the method of creating a heat transfer pump 104 and associated layers may vary according to any number and type of heat pump performance criteria associated with the particular implementation. These heat transfer pump characteristics and others are described in application serial number PCT/US2010/039200, entitled, "Electrocaloric Effect Materials and Thermal Diodes," filed on 18 Jun. 2010, and corresponding U.S. National Phase filing, U.S. application Ser. No. 12/999,684, entitled "Electrocaloric Effect Materials and Thermal Diodes," filed on 17 Dec. 2010, each of which is herein incorporated by reference in its entirety. It should be appreciated that a heat transfer pump 104 may include a single stack of alternating layers of electrocaloric effect material 202 and thermal rectifier material 204 as shown in FIG. 2, or may include multiple adjacent stacks of alternating layers of electrocaloric effect material 202 and thermal rectifier material 204.

Figure 3:
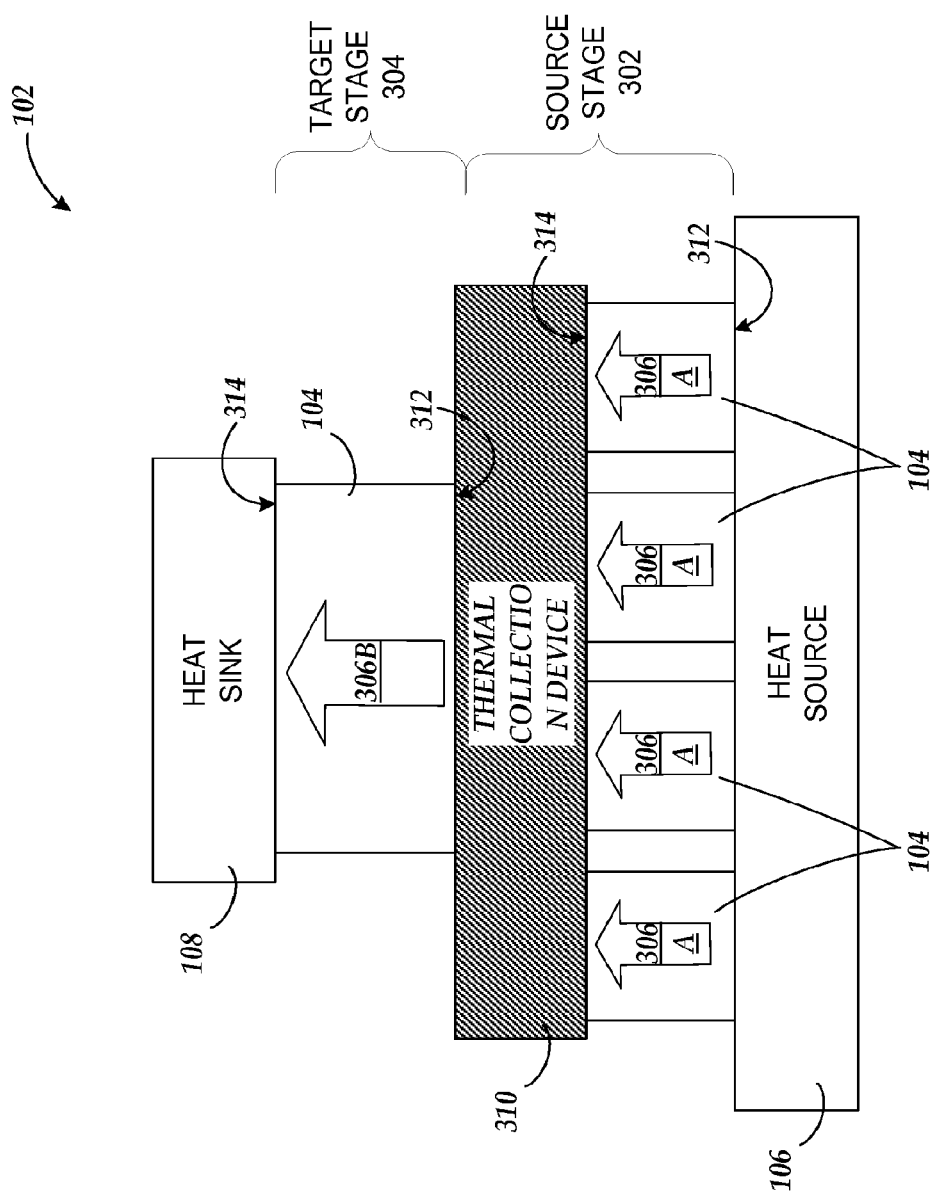
FIG. 3 is a block diagram of an example multistage thermal flow device utilizing heat transfer pumps and a thermal collection device configured in two stages to transfer thermal energy from a heat source and provide the thermal energy at a higher heat flux to a heat sink.

FIG. 3 is a block diagram of an example multistage thermal flow device 102 arranged in accordance with the present disclosure. The multistage thermal flow device 102 of this example utilizes multiple heat transfer pumps 104 and a thermal collection device 310 configured in two stages. This configuration provides the multistage thermal flow device 102 with the capability to transfer thermal energy from a heat source 106 according to a first heat flux and to provide the thermal energy from the heat source 106 to a heat sink 108 according to a higher second heat flux. According to this illustrative implementation, the multistage thermal flow device 102 may include two stages corresponding to a source stage 302 and a target stage 304. The source stage 302 may be configured to transfer thermal energy from the heat source 106 according to a first heat flux 306A. The target stage 304 may be configured to transfer the thermal energy from the source stage 302 to the heat sink 108 according to a second heat flux 306B. In this manner, the multistage thermal flow device 102 of FIG. 3 may be utilized as a thermal energy concentrator since it operates to transfer thermal energy from a large surface area of a heat source 106 at a relatively slow rate, and may route thermal energy to a smaller surface area of a heat sink 108 at a faster rate.

The open arrows depicted on the heat transfer pumps 104 are used throughout the figures to illustrate the transfer of thermal energy through each heat transfer pump 104 according to a particular heat flux. Heat flux will be referred to generally as "heat flux 306." The heat flux 306 of a particular stage will be illustrated using a reference letter, such as "heat flux 306A" for the heat flux 306 associated with the source stage 302 and "heat flux 306B" for the heat flux 306 associated with the target stage 304. According to various implementations, the heat flux 306 associated with each heat transfer pump 104 of a particular stage may be the same, with the heat flux 306 of subsequent adjacent stages increasing or decreasing depending on whether the multistage thermal flow device 102 is configured to concentrate or to diffuse heat, respectively.

The multistage thermal flow device 102 of this example may include a source stage 302 having four heat transfer pumps 104 and a single thermal collection device 310. The four heat transfer pumps 104 of the source stage 302 may each be thermally coupled to a surface of the heat source 106 at an input interface 312 of the heat transfer pump 104. At each heat transfer pump 104 of the source stage 302, thermal energy can be transferred from the heat source 106 via the input interface 312, through the heat transfer pump 104, and into the thermal collection device 310 via an output interface 314 at the end of the heat transfer pump 104 opposite the input interface 312. As previously discussed, the thermal energy can be transferred at a rate corresponding to the heat flux 306A associated with the heat pump 104, depending on variables such as electrocaloric effect material 202 characteristics, thermal rectifier material 204 characteristics, and applied electrode control signal characteristics.

Thermal energy from all of the heat transfer pumps 104 of the source stage 302 can be aggregated in the thermal collection device 310. The thermal collection device 310 may include any highly conductive material. Examples include, but are not limited to silicon, graphite, silicon carbide, metals, metal alloys, structures enclosing heat pipes or convective liquids, and so on.

The thermal collection device 310 may additionally be shaped and sized as desired according to the particular application. Although the thermal collection devices 310 are represented in the various figures as a block or rectangle, the thermal collection devices 310 may be shaped to facilitate optimal thermal coupling to the output interfaces 314 of the heat transfer pumps of the same stage, as well as to facilitate optimal thermal coupling to the input interfaces 312 of the heat transfer pumps 104 of the next sequential stage above in the multistage thermal flow device 102. In doing so, the thermal collection devices 310 may have any number of sides, with the sides having faces of any size and shape appropriate for thermal coupling to an associated component or stage. Similarly, the heat transfer pumps 104 may be configured according to any shape complimentary to the thermal collection device 310 that is advantageous depending on the particular implementation.

The multistage thermal flow device 102 of this example may include a source stage 302 having a single heat transfer pump 104, although multiple heat transfer pumps 104 may also be used. At the heat transfer pump 104 of the target stage 304, thermal energy can be transferred from the thermal collection device 310 via the input interface 312, through the heat transfer pump 104, and into the heat sink 108 via an output interface 314 of the heat transfer pump 104. The thermal energy can be transferred through the target stage 304 according to the heat flux 306B associated with the heat pump 104 of the target stage 304. As a simple example, the thermal energy may be transferred through each heat transfer pump 104 of the source stage 302 according to a heat flux 306A of about 1 W/cm$^2$, while the thermal energy can be transferred through the heat transfer pump 104 of the target stage 304 according to a heat flux 306B of about 4 W/cm$^2$. Combining the performance of the heat transfer pumps 104 of the source stage 302 together, the thermal energy can be removed from the heat source according to a total heat flux of about 4 W. Similarly, the thermal energy removed by the source stage 302 can be transferred to the heat sink 108 at about 4 W, but into a much reduced surface area of the heat sink 108 as compared to the surface area of the heat source 106 from which the thermal energy is removed, resulting in a larger temperature change of heat sink 108 than heat source 106.

Figure 5:
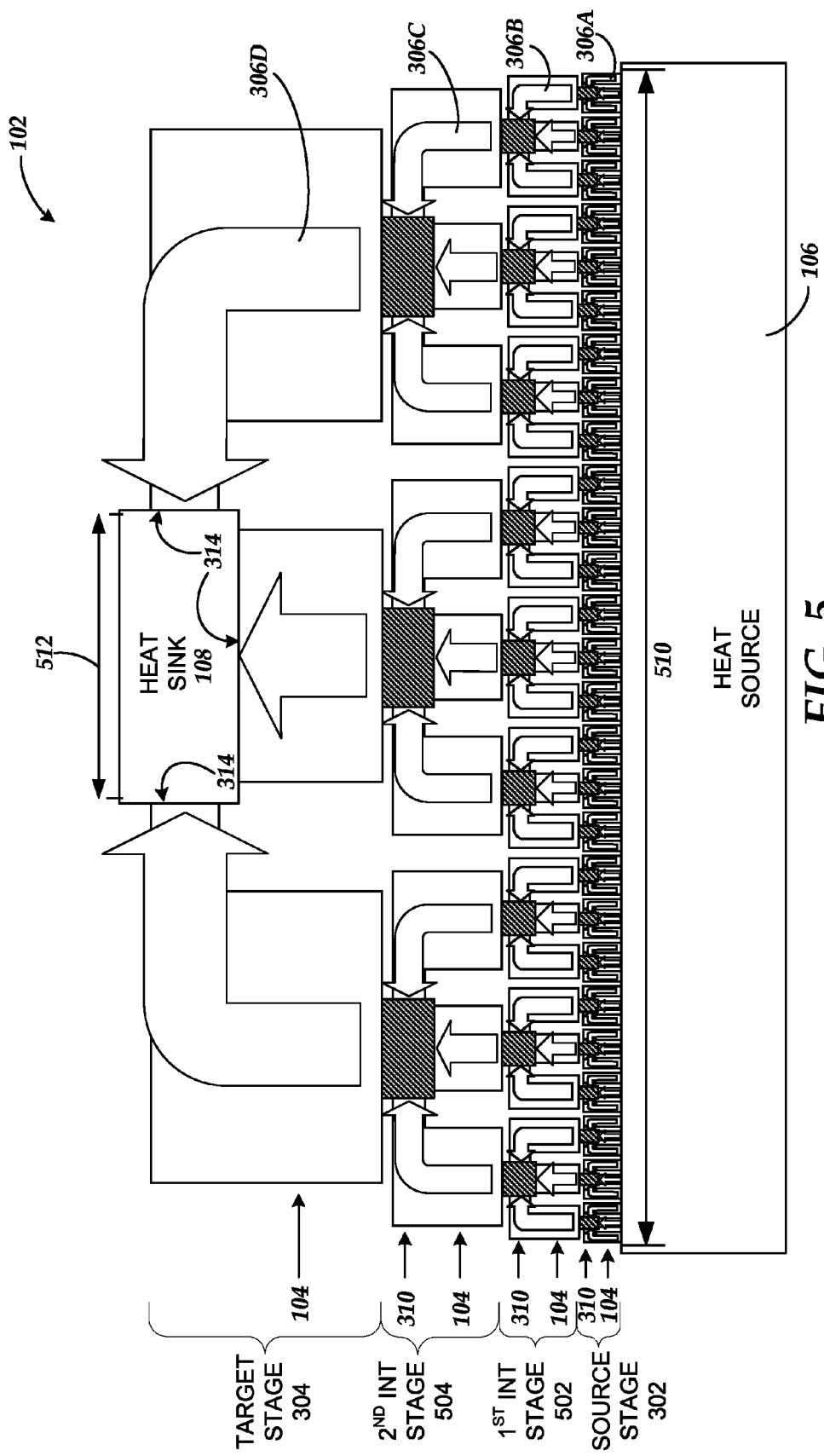
FIG. 5 is a block diagram of an example multistage thermal flow device utilizing heat transfer pumps and multiple thermal collection devices configured in four stages to transfer thermal energy from a heat source and provide the thermal energy at a higher heat flux to a heat sink.
Figure 6:
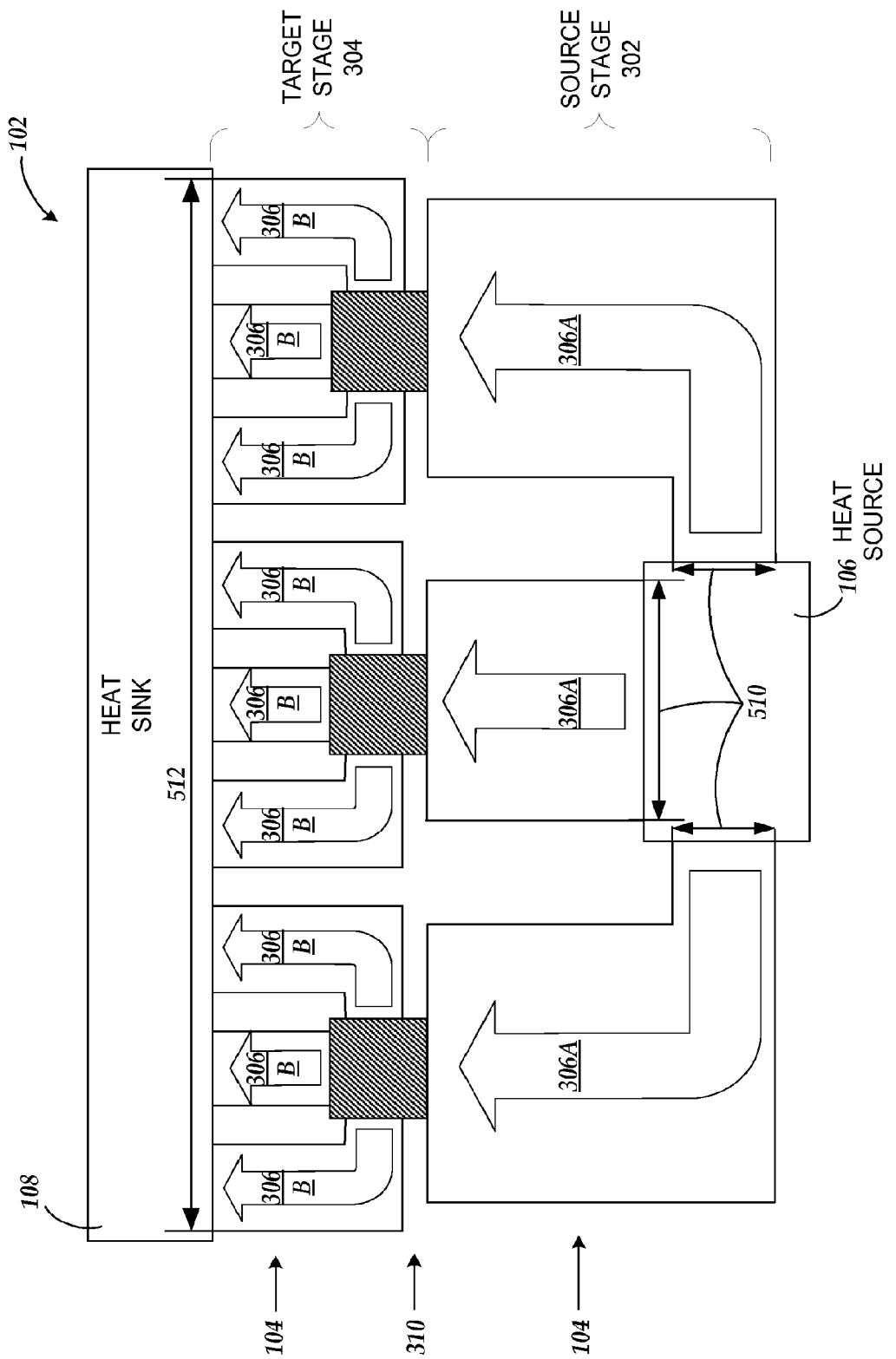
FIG. 6 is a block diagram of an example multistage thermal flow device utilizing heat transfer pumps and multiple thermal collection devices configured in two stages to transfer thermal energy from a heat source and provide the thermal energy at a lower heat flux to a heat sink.

It should be understood that the configuration of the multistage thermal flow device 102 shown in FIG. 3 is for illustration purposes to facilitate the discussion of the various aspects of the disclosure and is not intended to be limiting. For example, the target stage 304 of the multistage thermal flow device 102 may include two heat transfer pumps 104, each heat transfer pump 104 of the target stage 304 having a heat flux of about 2 W/cm$^2$ rather than having a single heat transfer pump 104 as shown. The multistage thermal flow device 102 may alternatively include any number of heat transfer pumps 104 of the source stage 302, any number of thermal collection devices 310, and any number of intermediate stages of heat transfer pumps 104 and thermal collection devices 310 positioned between the source stage 302 and target stage 304. An advantage of the multistage thermal flow device 102 described herein is that the staged configurations of heat transfer pumps 104 and corresponding thermal collection devices 310 may allow for the design to be easily customized according to the particular application in order to provide the combination of temperature and heat flux 306 for each stage that is most appropriate for the given situation. Other illustrative examples of configurations of the multistage thermal flow device 102 are shown in FIGS. 4-6 and described below.

Figure 4:
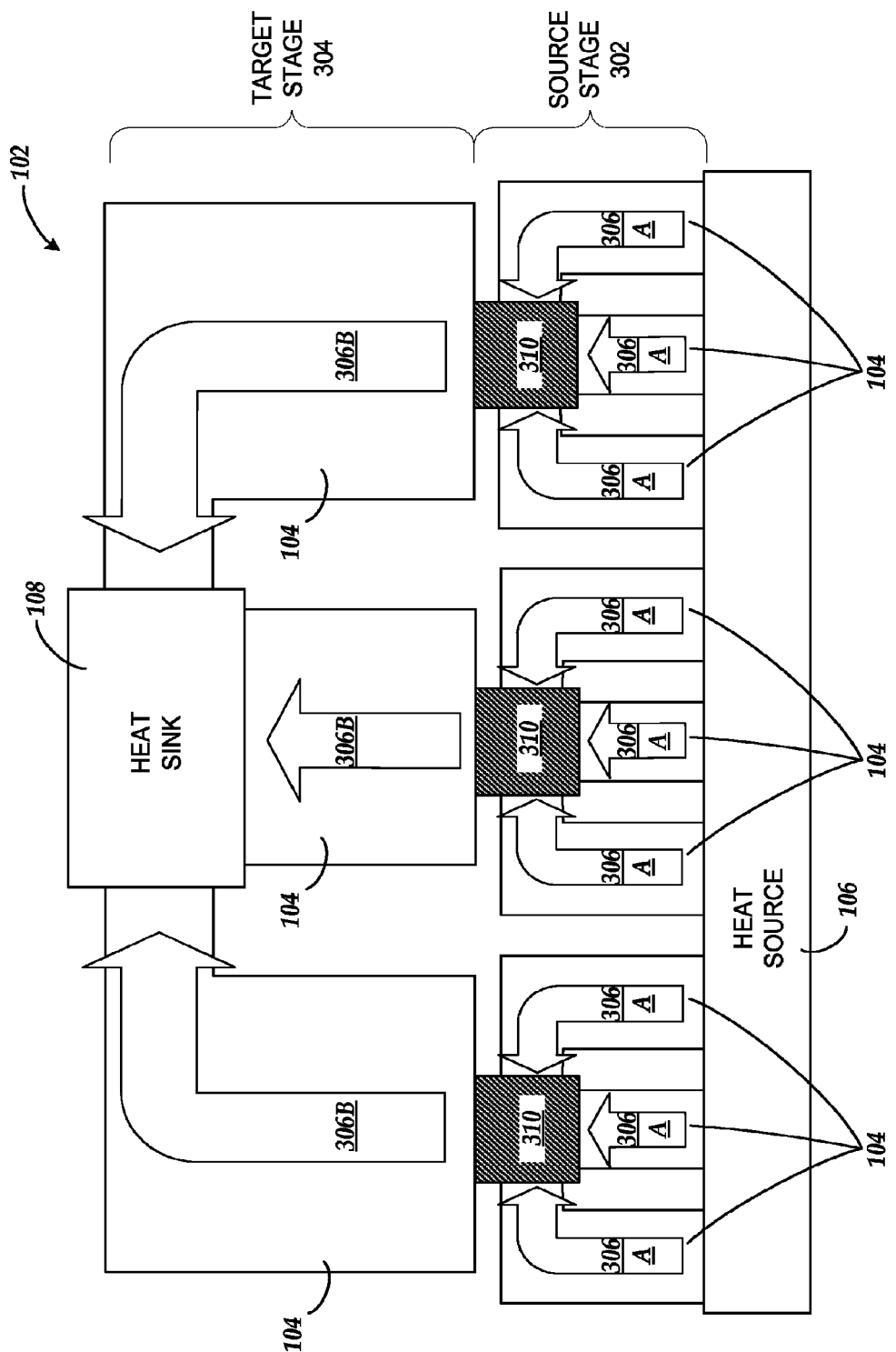
FIG. 4 is a block diagram of an example multistage thermal flow device utilizing heat transfer pumps and multiple thermal collection devices configured in two stages to transfer thermal energy from a heat source and provide the thermal energy at a higher heat flux to a heat sink.

FIG. 4 is a block diagram of an example multistage thermal flow device 102 arranged in accordance with the present disclosure. The multistage thermal flow device 102 of this example includes multiple heat transfer pumps 104 and multiple thermal collection devices 310 configured in two stages. This configuration provides the multistage thermal flow device 102 with the capability to transfer thermal energy from a heat source 106 according to a first heat flux 306A and to provide the thermal energy from the heat source 106 to a heat sink 108 according to a higher second heat flux 306B.

The multistage thermal flow device 102 shown in FIG. 4 is an alternative implementation illustrating the use of multiple thermal collection devices 310 in a two-stage configuration for concentrating and transferring thermal energy. This example utilizes nine heat transfer pumps 104 and three thermal collection devices 310 in the source stage 302. The nine heat transfer pumps 104 of the source stage 302 may be grouped into three subsets of heat transfer pumps 104. Each subset may include three heat transfer pumps 104 configured to transfer thermal energy into one thermal collection device 310 according to a first heat flux 306A. The target stage 304 may include a single heat transfer pump 104 coupled to each thermal collection device 310 and to the heat sink 108. The target stage 304 configuration may also be thought of as containing subsets of heat transfer pumps 104; however, the subsets in this example may each contain one heat transfer pump 104. The heat transfer pumps 104 of the target stage 304 is configured to transfer thermal energy from the thermal collection devices 310 to the heat sink 108 according to a second heat flux 306B.

In this example, the second heat flux 306B associated with the heat transfer pumps 104 of the target stage 304 is greater than the first heat flux 306A associated with the heat transfer pumps 104 of the source stage 302. Specifically, the ratio of the second heat flux 306B to the first heat flux 306A may be approximately 3:1 in this example. Although the heat transfer pumps 104 of the target stage 304 are shown to be larger than the heat transfer pumps 104 of the source stage 302, it should be appreciated that the heat transfer pumps 104 of all stages may be designed according to the same form factor, if desired. Heat transfer pumps 104 having identical or similar form factors but differing heat transfer capabilities may be created by varying the materials and/or the properties of the material layers and the electric field applied to control the transfer of thermal energy. Alternatively, the heat transfer pumps 104 of differing stages, or even heat transfer pumps 104 within the same stage, may vary in size, shape, or configuration.

One advantage of utilizing heat transfer pumps 104 of similar or identical form factor is for ease of manufacture and assembly of a multistage thermal flow device 102. A multistage thermal flow device 102 may be constructed for a custom application according to one or more factors such as the surface area from which thermal energy is to be removed from the heat source 106, the surface area through which the thermal energy is to be transferred into the heat sink 108, and/or the desired heat flux from which the thermal energy is to be removed from the heat source 106 and input to the heat sink 108. When assembling the multistage thermal flow device 102 for a particular application, a user may select the applicable number of heat transfer pumps 104 having the desired heat flux capabilities according to the desired form factor for the application and assemble accordingly.

The example shown in FIG. 4 depicts three heat transfer pumps 104 of the source stage 302 thermally coupled with three separate sides or faces of a thermal collection device 310. According to alternative implementations, each heat transfer pump 104 may interface with a common side or face of a thermal collection device 310, similar to the multistage thermal flow device 102 shown in FIG. 3. The specific interface configuration between components of a multistage thermal flow device 102 may depend on the particular application.

According to one implementation, the multistage thermal flow device 102 may be configured to utilize heat transfer pumps 104 within each stage that operate most efficiently at differing temperature ranges. Electrocaloric effect material 202 may operate efficiently within a particular temperature range that may vary depending on the specific type of material used. By utilizing heat transfer pumps 104 with different electrocaloric effect materials 202 that transfer thermal energy efficiently within different temperature ranges that overlap with temperature ranges of other heat transfer pumps 104 within the same stage, thermal energy may be effectively and efficiently transferred from the heat source 106 to the heat sink 108 throughout a wide operating temperature range of the heat source 106. The use of different electrocaloric effect materials 202 within adjacent heat transfer pumps 104 to efficiently remove thermal energy from a heat source 106 over a wide operating temperature range of the heat source 106 is described in detail in in application serial number PCT/US11/33220, entitled, "Heterogeneous Electrocaloric Effect Heat Transfer Device," filed on 20 Apr. 2011, and corresponding U.S. National Phase filing, U.S. application Ser. No. 13/145,948, entitled "Heterogeneous Electrocaloric Effect Heat Transfer Device," filed on 22 Jul. 2011, each of which is herein incorporated by reference in its entirety.

FIG. 5 is a block diagram of an example multistage thermal flow device 102 arranged in accordance with the present disclosure. The multistage thermal flow device 102 of this example includes multiple heat transfer pumps 104 and multiple thermal collection devices 310 configured in four stages. The multistage thermal flow device 102 of FIG. 5 is shown to illustrate a more complex implementation in which multiple intermediate stages are used between the source stage 302 and the target stage 304. It should be appreciated that any number of intermediate stages may be used within a multistage thermal flow device 102 according to the particular application. Likewise although all examples are shown in a two dimensional drawing for clarity purposes, the examples provided herein may also be realized in more complex three dimensional layouts that carry the described aspects into the additional space. In particular, for example, the thermal collection device 310 may have additional surfaces out of the plane of the page that may be coupled to additional heat transfer pumps 104 of the source stage 302 and/or the target stage 304. Alternately, the system may be realized as recurring implementations of the shown layout to fill the third dimension such as by extrusion or replication.

According to this example, a source stage 302 is thermally coupled to a surface area 510 of the heat source 106. The source stage 302 may include a number of heat transfer pumps 104 having a first heat flux 306A. The source stage 302 may include a number of thermal collection devices 310, with each thermal collection device 310 thermally coupled to a subset of heat transfer pumps 104. FIG. 5 depicts 81 heat transfer pumps 104 and 27 thermal collection devices 310 of the source stage 302, with each thermal collection device 310 thermally coupled to three heat transfer pumps 104.

A first intermediate stage 502 is thermally coupled to the source stage 302. The first intermediate stage 502 may include a number of heat transfer pumps 104 having a second heat flux 306B. The first intermediate stage 502 may include a number of thermal collection devices 310, with each thermal collection device 310 thermally coupled to a subset of heat transfer pumps 104. FIG. 5 also depicts 27 heat transfer pumps 104 and 9 thermal collection devices 310 of the first intermediate stage 504, with each thermal collection device 310 thermally coupled to three heat transfer pumps 104.

A second intermediate stage 504 is thermally coupled to the first intermediate stage 502. The second intermediate stage 504 may include a number of heat transfer pumps 104 having a third heat flux 306C. The second intermediate stage 504 may include a number of thermal collection devices 310, with each thermal collection device 310 thermally coupled to a subset of heat transfer pumps 104. FIG. 5 further depicts 9 heat transfer pumps 104 and 3 thermal collection devices 310 of the second intermediate stage 504, with each thermal collection device 310 thermally coupled to three heat transfer pumps 104.

A target stage 304 is thermally coupled to the second intermediate stage 504. The target stage 304 may include a number of heat transfer pumps 104 having a fourth heat flux 306D. The heat transfer pumps 104 of the target stage 304 are thermally coupled to a surface area 512 of the heat sink 108 and transfer thermal energy from the thermal collection devices 310 of the second intermediate stage 504 directly into the heat sink 108. FIG. 5 also depicts 3 heat transfer pumps 104 of the target stage 304.

In this example, the heat flux 306 of each stage may get progressively larger from the source stage 302 through the target stage 304. According to this configuration in which each thermal collection device 310 is coupled to three heat transfer pumps 104 of a lower stage, each heat transfer pump 104 of a stage may have approximately three times the heat flux of the heat transfer pumps 104 of the lower stage from which the thermal energy is transferred. It should be appreciated that the letter designations (306A, 306B, 306C, 306D) of the heat flux associated with each stage, as well as the terminology used to identify each stage with respect to other stages, are provided solely for clarity while describing each example provided in the figures and are not germane to the concepts described herein. In other words, the example multistage thermal flow device 102 of FIG. 5 could have been described with the source stage 302 and the target stage 304 having first and second heat fluxes 306A and 306B, respectively, with the first intermediate stage 502 and the second intermediate stage 504 having third and fourth heat fluxes 306C and 306D, respectively.

One of the various concepts that is illustrated by the various example configurations described herein is that each consecutive stage from the heat source 106 to the heat sink 108 may have a greater heat flux value as compared to the preceding stage in a configuration that is designed to concentrate the thermal energy from a larger surface area 510 to a smaller surface area 512. As will be described with respect to FIG. 6, each consecutive stage from the heat source 106 to the heat sink 108 may have a lower heat flux value as compared to the preceding stage in a configuration that is designed to diffuse the thermal energy from a smaller surface area to a larger surface area.

As an illustrative example, the configuration of the multistage thermal flow device 102 of FIG. 5 will be described in greater detail using sample data pertaining to a specific application. It should be understood that this data is for illustrative purposes only and is not intended to be limiting. According to this example, each heat transfer pump 104 of the source stage 302 may have an input interface 312 with a surface area of approximately 1.8 $cm^2$, which results in the source stage 302 being thermally coupled to a surface area 510 of the heat source 106 of approximately 145.8 cm². Each heat transfer pump 104 of the target stage 304 may have an output interface 314 with a surface area of approximately 1.2 cm², with the heat sink 108 having an output interface 314 of approximately 1.5 cm². The electrocaloric effect material 202 throughout the various heat transfer pumps 104 may be comprised of piezoelectric material such as lead zirconate-titanate, or PZT. The thermal rectifier material 204 used within the heat transfer pumps 104 of the source stage 302 and of the first intermediate stage 502 may be comprised of silicon and/or copper-zinc. The thermal rectifier material 204 used within the heat transfer pumps 104 of the second intermediate stage 504 and of the target stage 304 may be comprised of silicon and/or silver-palladium. The thermal rectifier material 204 used in each stage may be selected according to the temperature range in which the thermal rectifier material 204 will be transferring thermal energy.

The values of the thermal rectifier material 204 layer thickness, the electrocaloric effect material 202 layer thickness, and the frequency of the electrode control signal provided for the various consecutive stages from the source stage 302 up to the target stage 304 may be given as: 400 um/50 um/300 Hz, 360 um/8 um/1 kHz, 400 um/12 um/800 Hz, and/or 300 um/8 um/2 kHz. The thermal collection devices 310 may be comprised of silicon. According to this example, the heat flux 306 changes from a heat flux 306A in the source stage 302 of approximately 0.01 W/cm² to a heat flux 306B in the first intermediate stage 502 of approximately 0.035 W/cm² to a heat flux 306C in the second intermediate stage 504 of approximately 0.112 W/cm² to a heat flux 306D in the target stage 304 of approximately 0.35 W/cm². In doing so, thermal energy can be transferred into the heat sink 108 at approximately 1.01 W/cm², which is about a 100 to 1 ratio of heat flux 306 to surface area with respect to the heat source 106 and the heat sink 108.

FIG. 6 is a block diagram of an example multistage thermal flow device 102 arranged in accordance with the present disclosure. The multistage thermal flow device 102 of this example utilizes multiple heat transfer pumps 104 and multiple thermal collection devices 310 configured in two stages. This configuration provides the multistage thermal flow device 102 with the capability to transfer thermal energy from a heat source 106 according to a first heat flux and to provide the thermal energy from the heat source 106 to a heat sink 108 according to a lower second heat flux. Previously described examples of a multistage thermal flow device 102 operated to concentrate the thermal energy removed from a surface area 510 of a heat source 106 that is relatively large to a surface area 512 of a heat sink 108 that is smaller than the surface area 510. As depicted in FIG. 6, the multistage thermal flow device 102 can operate to diffuse the thermal energy removed from a surface area 510 of a heat source 106 that is relatively small to a surface area 512 of a heat sink 108 that is larger than the surface area 510. This example may be seen as a configuration that is opposite of that shown in FIG. 4.

In this example, the source stage 302 may include three heat transfer pumps 104, each having a heat flux 306A. The heat transfer pumps 104 of the source stage 302 are each thermally coupled to a surface area 510 of the heat source 106 and to a single thermal collection device 310. The target stage 304 of this example configuration includes three heat transfer pumps 104, each having a heat flux 306B that is approximately ⅓ the heat flux 306A. The heat transfer pumps 104 of the target stage 304 are coupled to the thermal collection devices 310, where they receive thermal energy from the source stage 302 and transfer it to the surface area 512 of the heat sink 108. It should be appreciated that the heat diffuser configuration of the multistage thermal flow device 102 shown in FIG. 6 may alternatively include any number of stages, each stage including any number of heat transfer pumps 104 and thermal collection devices 310.

Figure 7:
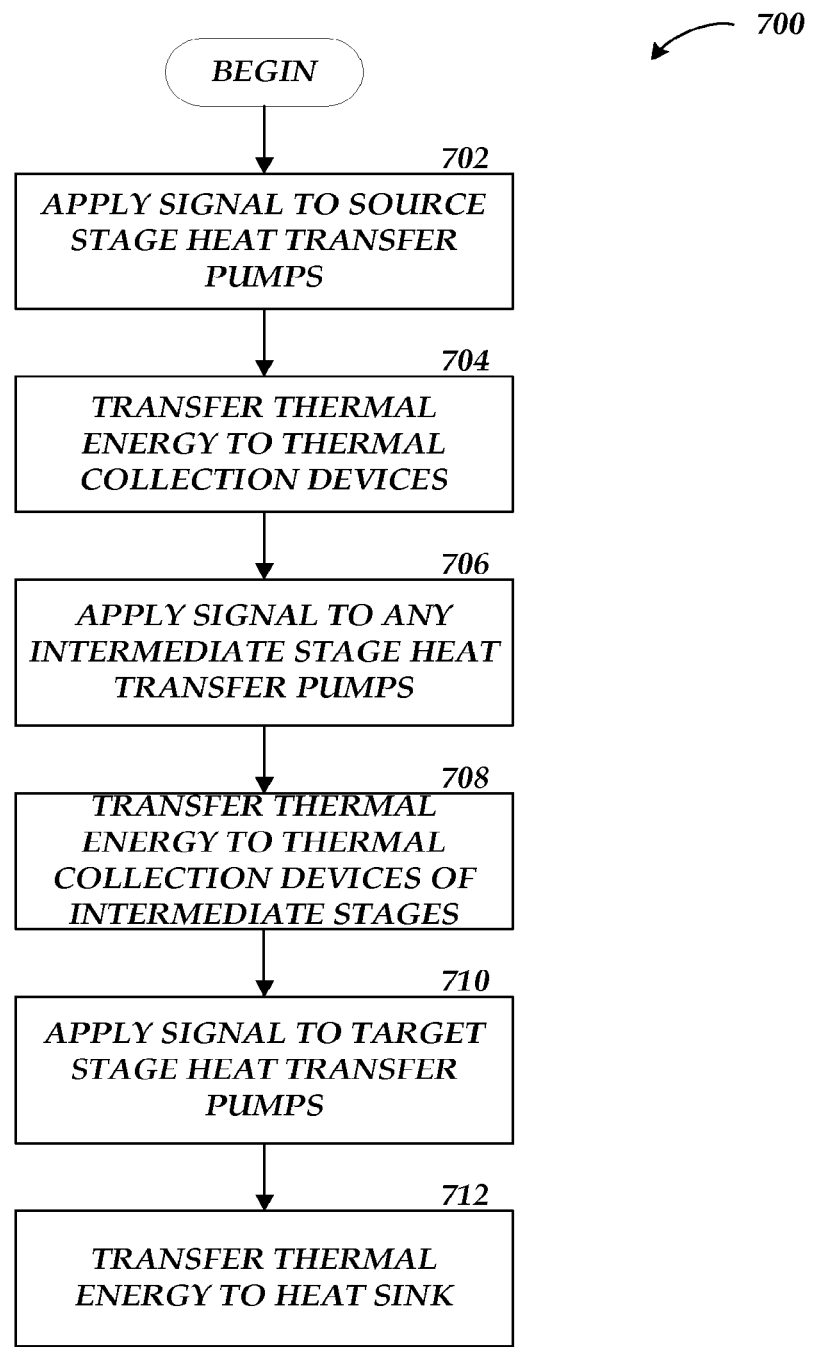
FIG. 7 is a flow diagram illustrating an example process for implementing a multistage thermal flow device.

FIG. 7 is a flow diagram illustrating an example process 700 for implementing a multistage thermal flow device 102 arranged in accordance with the present disclosure. The process 700 may include various operations, functions, or actions as illustrated by one or more of blocks 702-708. It should be appreciated that more or fewer operations may be performed than shown in the FIG. 7 and described herein. Moreover, these operations may also be performed in a different order than those described herein or simultaneously.

The process 700 may begin at block 702 (Apply Signal To Source Stage Heat Transfer Pumps). At block 702 the controller 112 may be configured to apply an electrode control signal to the applicable electrodes 114 corresponding to the electrocaloric effect material 202 of the heat transfer pumps 104 of the source stage 302. The applied electrode control signal results in an electric field that selectively activates the electrocaloric effect material 202 within the heat transfer pumps 104 of the source stage 302. Processing may continue from block 702 to block 704.

At block 704 (Transfer Thermal Energy To Thermal Collection Devices), the heat transfer pumps 104 of the source stage 302 are selectively activated by the electric field to transfer thermal energy from the heat source 106 to one or more thermal collection devices 310. The thermal energy can be transferred according to a designed heat flux 306. Processing may continue from block 704 to block 706.

At block 706 (Apply Signal To Any Intermediate Stage Heat Transfer Pumps), if the multistage thermal flow device 102 is configured with any intermediate stages, then the controller 112 may be configured to apply an electrode control signal to the applicable electrodes 114 of the applicable intermediate stage. Application of the electrode control signal results in the electric field that selectively activates the associated electrocaloric effect material 202. The application of the electrode control signal may occur substantially simultaneously or may be otherwise coordinated with the application of the electrode control signal to the source stage 302. Processing may continue from block 706 to block 708.

At block 708 (Transfer Thermal Energy To Thermal Collection Devices Of Intermediate Stages), the heat transfer pumps 104 of the applicable intermediate stages are selectively activated by the electric field to transfer thermal energy from the thermal collection devices 310 of an adjacent lower stage to one or more thermal collection devices 310 of the intermediate stages. The thermal energy can be transferred according to a designed heat flux 306. If the multistage thermal flow device 102 is configured to concentrate the thermal energy from the heat source 106 into a smaller surface area of the heat sink 108, then the heat flux 306 associated with the intermediate stages may be progressively greater than the heat flux 306 associated with the source stage 302. If the multistage thermal flow device 102 is configured to diffuse the thermal energy from the heat source 106 into a larger surface area of the heat sink 108, then the heat flux 306 associated with the intermediate stages may be progressively less than the heat flux 306 associated with the source stage 302. Processing may continue from block 708 to block 710.

At block 710 (Apply Signal To Target Stage Heat Transfer Pumps), the controller 112 may be configured to apply an electrode control signal to the applicable electrodes 114 corresponding to the electrocaloric effect material 202 of the heat transfer pumps 104 of the target stage 304. The applied electrode control signal results in an electric field that activates the electrocaloric effect material 202 within the heat transfer pumps 104 of the target stage 304. Processing may continue from block 710 to block 712.

At block 712 (Transfer Thermal Energy To Heat Sink), the heat transfer pumps 104 of the target stage 304 arc activated by the electric field to transfer thermal energy from the thermal collection devices 310 of an adjacent lower stage to the heat sink 108. The thermal energy is transferred according to a selected heat flux 306. The selected heat flux 306 may be greater than a heat flux 306 of an adjacent lower stage if the multistage thermal flow device 102 is configured to concentrate the thermal energy from the heat source 106. Conversely, the selected heat flux 306 may be less than a heat flux 306 of an adjacent lower stage if the multistage thermal flow device 102 is configured to diffuse the thermal energy from the heat source 106.

Figure 8:
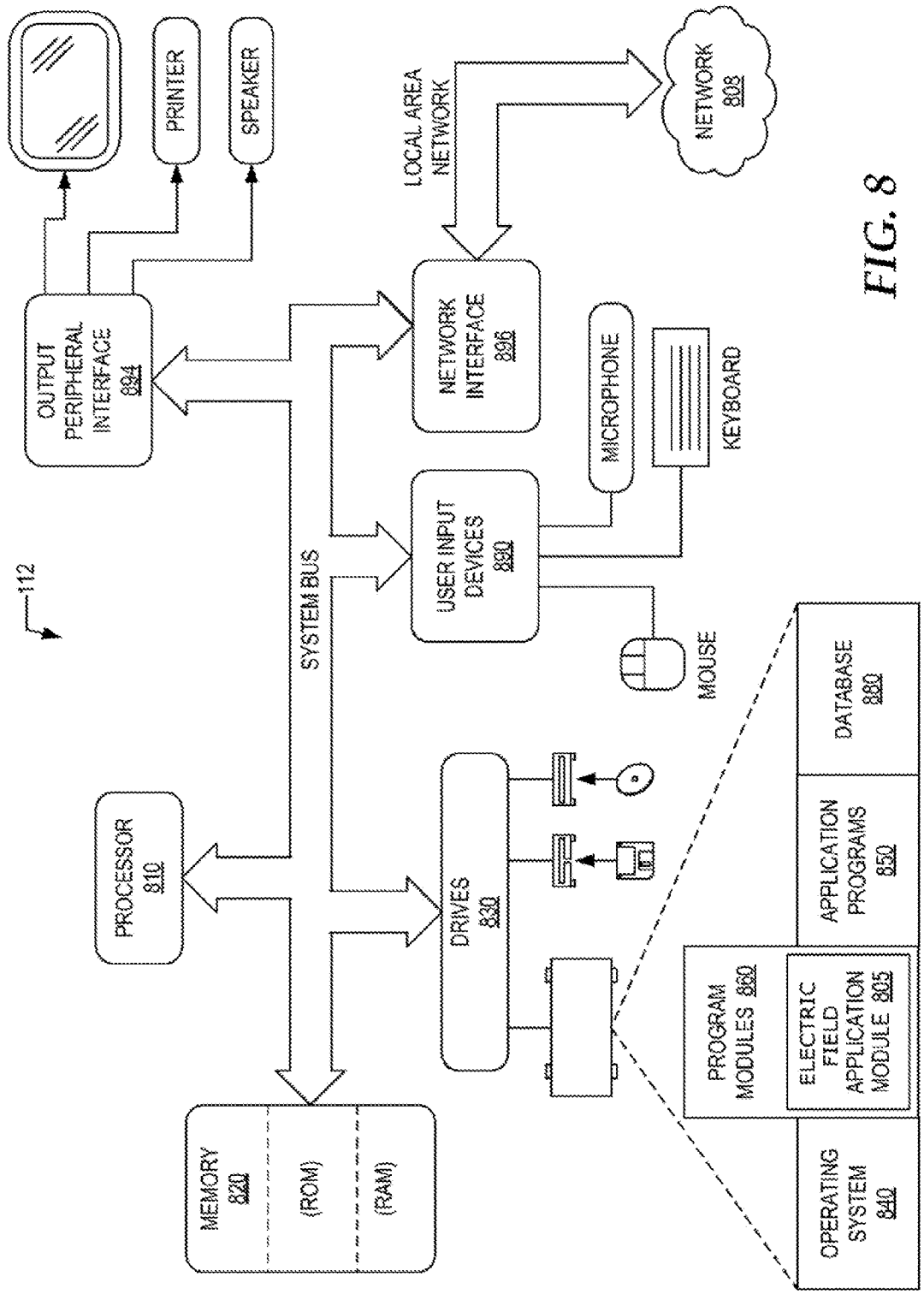
FIG. 8 is a block diagram illustrating a computer hardware architecture corresponding to an example controller, all arranged in accordance with at least some embodiments described herein.
Figure 3:
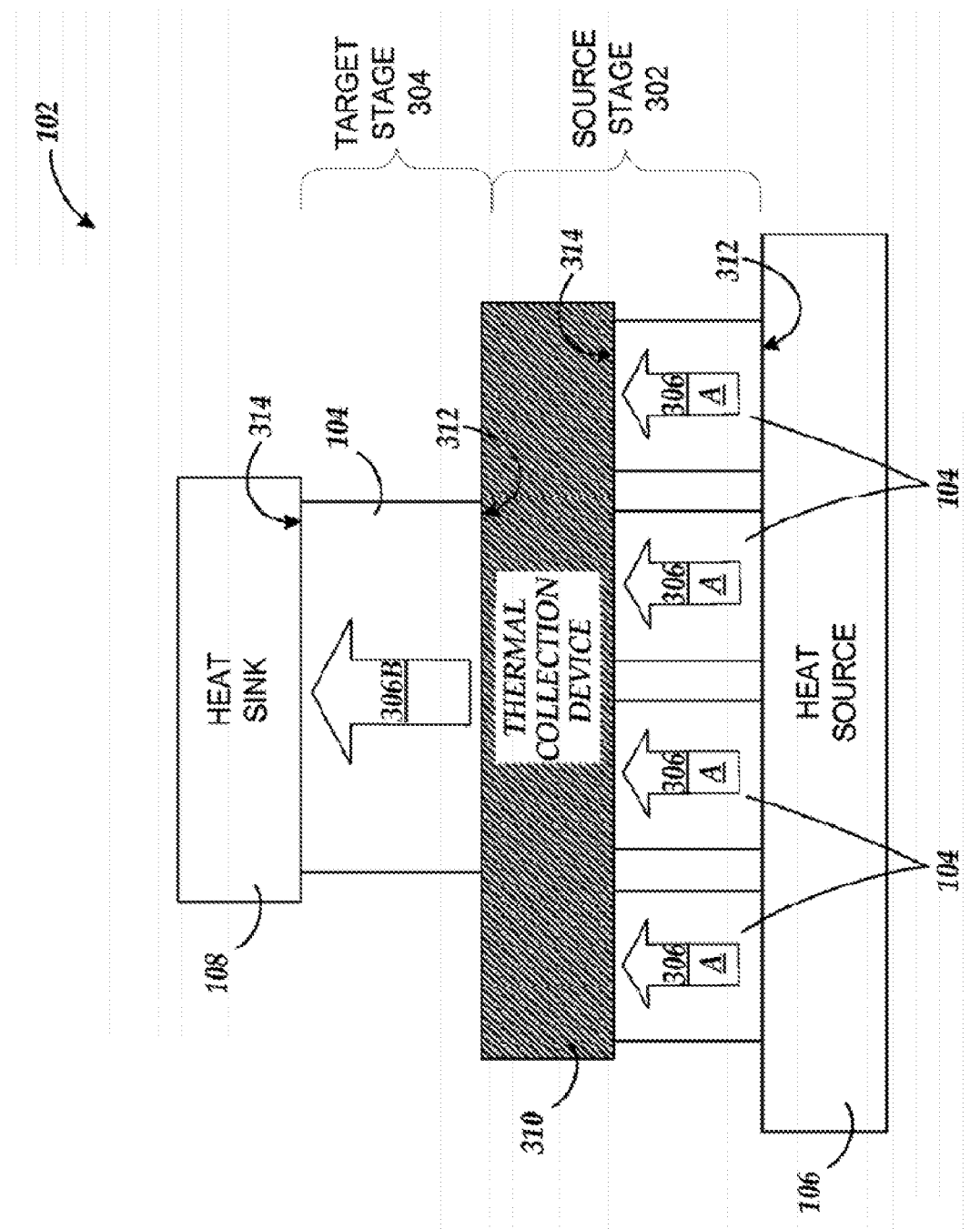
Figure 6:
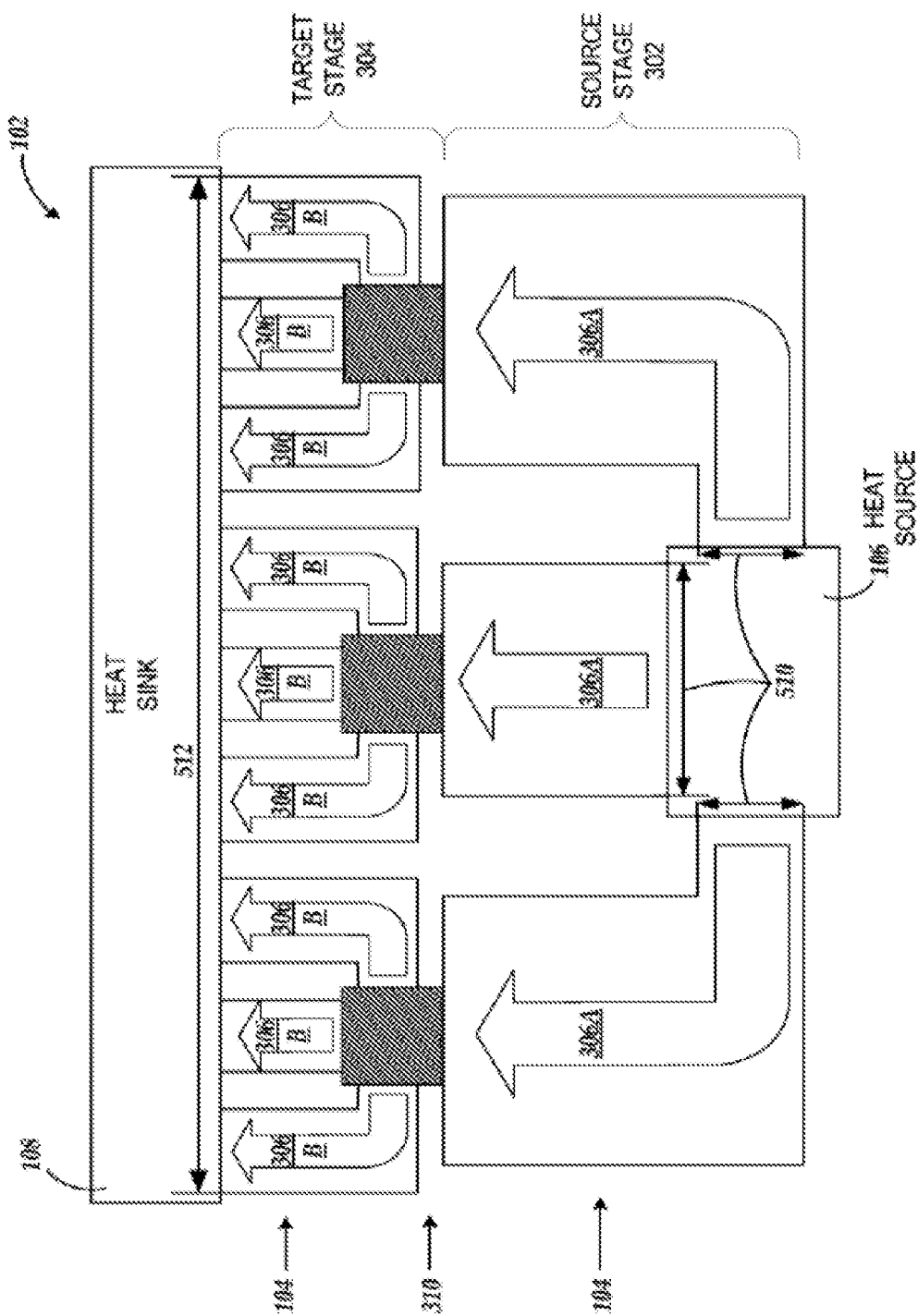

FIG. 8 is a block diagram illustrating a computer hardware architecture that may correspond to an example controller 112 configured in accordance with at least some embodiments presented herein. FIG. 8 includes a controller 112, including a processor 810, memory 820 and one or more drives 830. The controller 112 may be implemented as a conventional computer system, an embedded control computer, a laptop, or a server computer, a mobile device, a set-top box, a kiosk, a vehicular information system, a mobile telephone, a customized machine, or other hardware platform.

The drives 830 and their associated computer storage media, provide storage of computer readable instructions, data structures, program modules and other data for the controller 112. The drives 830 can include an operating system 840, application programs 850, program modules 860, and a database 880. The program modules 860 may include an electric field application module 805. The electric field application module 805 may be adapted to execute the process 700 for implementing a multistage thermal flow device 102 to concentrate or diffuse thermal energy from a heat source 106 to a heat sink 108 as described in greater detail above (e.g., see previous description with respect to one or more of FIGS. 1-7). The controller 112 may further include user input devices 890 through which a user may enter commands and data. Input devices can include an electronic digitizer, a microphone, a keyboard and pointing device, commonly referred to as a mouse, trackball or touch pad. Other input devices may include a joystick, game pad, satellite dish, scanner, or the like.

These and other input devices can be coupled to the processor 810 through a user input interface that is coupled to a system bus, but may be coupled by other interface and bus structures, such as a parallel port, game port or a universal serial bus ("USB"). Computers such as the controller 112 may also include other peripheral output devices such as speakers, which may be coupled through an output peripheral interface 894 or the like.

The controller 112 may operate in a networked environment using logical connections to one or more computers, such as a remote computer coupled to a network interface 896. The remote computer may be a personal computer, a server, a router, a network PC, a peer device or other common network node, and can include many or all of the elements described above relative to the controller 112. Networking environments are commonplace in offices, enterprise-wide area networks ("WAN"), local area networks ("LAN"), intranets, and the Internet.

When used in a LAN or WLAN networking environment, the controller 112 may be coupled to the LAN through the network interface 896 or an adapter. When used in a WAN networking environment, the controller 112 typically includes a modem or other means for establishing communications over the WAN, such as the Internet or the network 808. The WAN may include the Internet, the illustrated network 808, various other networks, or any combination thereof. It will be appreciated that other mechanisms of establishing a communications link, ring, mesh, bus, cloud, or network between the computers may be used.

According to some embodiments, the controller 112 may be coupled to a networking environment. The controller 112 may include one or more instances of a physical computer-readable storage medium or media associated with the drives 830 or other storage devices. The system bus may enable the processor 810 to read code and/or data to/from the computer-readable storage media. The media may represent an apparatus in the form of storage elements that are implemented using any suitable technology, including but not limited to semiconductors, magnetic materials, optical media, electrical storage, electrochemical storage, or any other such storage technology. The media may represent components associated with memory 820, whether characterized as RAM, ROM, flash, or other types of volatile or nonvolatile memory technology. The media may also represent secondary storage, whether implemented as the storage drives 830 or otherwise. Hard drive implementations may be characterized as solid state, or may include rotating media storing magnetically-encoded information.

The storage media may include one or more program modules 860. The program modules 860 may include software instructions that, when loaded into the processor 810 and executed, transform a general-purpose computing system into a special-purpose computing system. As detailed throughout this description, the program modules 860 may provide various tools or techniques by which the controller 112 may participate within the overall systems or operating environments using the components, logic flows, and/or data structures discussed herein.

The processor 810 may be constructed from any number of transistors or other circuit elements, which may individually or collectively assume any number of states. More specifically, the processor 810 may operate as a state machine or finite-state machine Such a machine may be transformed to a second machine, or specific machine by loading executable instructions contained within the program modules 860. These computer-executable instructions may transform the processor 810 by specifying how the processor 810 transitions between states, thereby transforming the transistors or other circuit elements constituting the processor 810 from a first machine to a second machine The states of either machine may also be transformed by receiving input from the one or more user input devices 890, the network interface 896, other peripherals, other interfaces, or one or more users or other actors. Either machine may also transform states, or various physical characteristics of various output devices such as printers, speakers, video displays, or otherwise.

Encoding the program modules 860 may also transform the physical structure of the storage media. The specific transformation of physical structure may depend on various factors, in different implementations of this description. Examples of such factors may include, but are not limited to:

the technology used to implement the storage media, whether the storage media are characterized as primary or secondary storage, and the like. For example, if the storage media are implemented as semiconductor-based memory, the program modules 860 may transform the physical state of the semiconductor memory 820 when the software is encoded therein. For example, the software may transform the state of transistors, capacitors, or other discrete circuit elements constituting the semiconductor memory 820.

As another example, the storage media may be implemented using magnetic or optical technology such as drives 830. In such implementations, the program modules 860 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. It should be appreciated that various other transformations of physical media are possible without departing from the scope and spirit of the present description.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., " a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A multistage thermal flow device, comprising:
 a source stage that comprises:
  a first heat transfer pump that includes a first heat flux,
   wherein the first heat transfer pump comprises:

a first input interface adapted to thermally couple to a heat source;
a first output interface adapted to provide thermal energy transferred from the first input interface; and
first alternately stacked layers of a thermal rectifier material and a first electrocaloric effect material, wherein the first alternately stacked layers include a plurality of layers of the thermal rectifier material and a plurality of layers of the first electrocaloric effect material; and
a thermal collection device thermally coupled to the first output interface of the first heat transfer pump;
a target stage that comprises:
a second heat transfer pump that includes a second heat flux that is different from the first heat flux of the first heat transfer pump, wherein the second heat transfer pump comprises:
a second input interface thermally coupled to the thermal collection device;
a second output interface adapted to provide thermal energy from the second input interface to a heat sink; and
second alternately stacked layers of the thermal rectifier material and a second electrocaloric effect material, wherein the second alternately stacked layers include a plurality of layers of the thermal rectifier material and a plurality of layers of the second electrocaloric effect material,
a plurality of electrodes coupled to the source stage and the target stage; and
a controller operatively coupled to the plurality of electrodes to control application of at least one oscillatory electrode control signal to the source stage and the target stage;
wherein:
the source stage comprises a plurality of first heat transfer pumps that include the first heat transfer pump and that each include the first heat flux;
the target stage comprises one or more second heat transfer pumps that include the second heat transfer pump and that each include the second heat flux;
a quantity of the plurality of first heat transfer pumps is different than a quantity of the one or more second heat transfer pumps;
thermal energy collected by the one or more first heat transfer pumps thermally coupled to a first surface area of the heat source is concentrated or diffused into a second surface area of the heat sink that is thermally coupled to the one or more second heat transfer pumps and that is smaller or larger than the first surface area of the heat source;
the thermal collection device includes a first surface and a second surface different than the first surface;
the first heat transfer pump of the plurality of first heat transfer pumps of the source stage has a first shape with a third surface that is directly coupled to the first surface of the thermal collection device;
an other heat transfer pump of the plurality of first heat transfer pumps of the source stage has a second shape with a fourth surface that is directly coupled to the second surface of the thermal collection device; and
the first shape of the first heat transfer pump of the plurality of first heat transfer pumps of the source stage is different than the second shape of the other heat transfer pump of the plurality of first heat transfer pumps of the source stage.

2. The multistage thermal flow device of claim 1, wherein:
the one or more second heat transfer pumps of the target stage comprise a plurality of second heat transfer pumps of the target stage; and
the source stage further comprises a plurality of thermal collection devices, each thermal collection device thermally coupled to a first quantity of the plurality of first heat transfer pumps of the source stage and to a second quantity of the plurality of second heat transfer pumps of the target stage that is different from the first quantity.

3. The multistage thermal flow device of claim 2, further comprising:
a first intermediate stage disposed between the source stage and the target stage, wherein the first intermediate stage comprises:
a plurality of heat transfer pumps of the first intermediate stage, wherein each heat transfer pump of the first intermediate stage comprises a corresponding input interface adapted to thermally couple to a corresponding thermal collection device of the source stage, a corresponding output interface adapted to provide thermal energy transferred from the corresponding input interface, and a third electrocaloric effect material, and wherein each heat transfer pump of the first intermediate stage includes a third heat flux between the first heat flux and the second heat flux; and
a plurality of thermal collection devices of the first intermediate stage, each thermal collection device of the first intermediate stage thermally coupled to a third quantity of heat transfer pumps of the first intermediate stage that is between the first quantity and the second quantity such that each thermal collection device of the source stage is thermally coupled to the second quantity of the plurality of heat transfer pumps of the target stage via the first intermediate stage.

4. The multistage thermal flow device of claim 3, further comprising:
a second intermediate stage disposed between the first intermediate stage and the target stage, wherein the second intermediate stage comprises:
a plurality of heat transfer pumps of the second intermediate stage, wherein each heat transfer pump of the second intermediate stage comprises a corresponding input interface adapted to thermally couple to a corresponding thermal collection device of the first intermediate stage, a corresponding output interface adapted to provide thermal energy transferred from the corresponding input interface, and a fourth electrocaloric effect material, and wherein each heat transfer pump of the second intermediate stage includes a fourth heat flux between the third heat flux and the second heat flux; and
a plurality of thermal collection devices of the second intermediate stage, each thermal collection device of the second intermediate stage thermally coupled to a fourth quantity of heat transfer pumps of the second intermediate stage that is between the third quantity and the second quantity such that each thermal collection device of the source stage is thermally coupled to the second quantity of the plurality of heat transfer pumps of the target stage via the first intermediate stage and the second intermediate stage.

5. The multistage thermal flow device of claim 4, wherein:
the first quantity of the plurality of first heat transfer pumps of the source stage is greater than the second quantity of the plurality of second heat transfer pumps of the target stage; and
the first heat flux of the plurality of first heat transfer pumps of the source stage is less than the second heat flux of the plurality of second heat transfer pumps of the target stage.

6. The multistage thermal flow device of claim 4, wherein:
the first quantity of the plurality of first heat transfer pumps of the source stage is less than the second quantity of the plurality of second heat transfer pumps of the target stage; and
the first heat flux of the plurality of first heat transfer pumps of the source stage is greater than the second heat flux of the plurality of second heat transfer pumps of the target stage.

7. The multistage thermal flow device of claim 1, further comprising a plurality of intermediate stages disposed between the source stage and the target stage.

8. The multistage thermal flow device of claim 1, wherein:
the source stage further comprises a plurality of thermal collection devices;
the one or more second heat transfer pumps of the target stage include a plurality of second heat transfer pumps of the target stage;
a quantity of the plurality of first heat transfer pumps of the source stage is greater than a quantity of the plurality of second heat transfer pumps of the target stage; and
the first heat flux is less than the second heat flux.

9. The multistage thermal flow device of claim 1, wherein;
the source stage further includes a plurality of thermal collection devices;
the one or more second heat transfer pumps of the target stage include a plurality of second heat transfer pumps of the target stage;
a quantity of the plurality of first heat transfer pumps of the source stage is less than a quantity of the plurality of second heat transfer pumps of the target stage; and
the first heat flux is greater than the second heat flux.

10. The multistage thermal flow device of claim 1, wherein the thermal rectifier material includes an asymmetrical thermal conductance characteristic in that heat is transported more readily in a first direction from the heat source to the heat sink than in a second direction from the heat sink to the heat source.

11. A multistage thermal flow concentration device, comprising:
a plurality of heat transfer pumps of a source stage and that includes a first heat flux, wherein each of the plurality of heat transfer pumps of the source stage comprises alternately stacked layers of a thermal rectifier material and a first electrocaloric effect material, each of the plurality of heat transfer pumps of the source stage configured to transfer thermal energy from a heat source according to the first heat flux;
a thermal collection device of the source stage thermally coupled to the plurality of heat transfer pumps of the source stage such that the plurality of heat transfer pumps of the source stage transfer thermal energy from the heat source to the thermal collection device of the source stage; and
at least one heat transfer pump of a target stage and that includes a second heat flux that is greater than the first heat flux, wherein the target stage is thermally coupled to the thermal collection device of the source stage and comprises a second electrocaloric effect material, the at least one heat transfer pump of the target stage configured to transfer the thermal energy from the thermal collection device of the source stage to a heat sink according to the second heat flux,
wherein:
thermal energy collected by the plurality of heat transfer pumps of the source stage thermally coupled to a first surface area of the heat source is concentrated or diffused into a second surface area of the heat sink that is thermally coupled to the at least one heat transfer pump of the target stage and that is smaller or larger than the first surface area of the heat source;
the thermal collection device includes a first surface and a second surface different than the first surface;
a first heat transfer pump of the plurality of heat transfer pumps of the source stage has a first shape with a third surface that is directly coupled to the first surface of the thermal collection device;
a second heat transfer pump of the plurality of heat transfer pumps of the source stage has a second shape with a fourth surface that is directly coupled to the second surface of the thermal collection device; and
the second shape of the second heat transfer pump is different than the first shape of the first heat transfer pump.

12. The multistage thermal flow concentration device of claim 11, further comprising:
a plurality of thermal collection devices of the source stage, each thermal collection device of the source stage thermally coupled to a subset of the plurality of heat transfer pumps of the source stage and thermally coupled to the at least one heat transfer pump of the target stage.

13. The multistage thermal flow concentration device of claim 12, further comprising:
a plurality of heat transfer pumps of a first intermediate stage, wherein each heat transfer pump of the first intermediate stage comprises a third electrocaloric effect material and includes a third heat flux that is greater than the first heat flux and less than the second heat flux; and
a plurality of thermal collection devices of the first intermediate stage, each thermal collection device of the first intermediate stage thermally coupled to a subset of the plurality of heat transfer pumps of the first intermediate stage and thermally coupled to the at least one heat transfer pump of the target stage such that the at least one heat transfer pump of the is thermally coupled indirectly to the plurality of thermal collection devices of the source stage via the first intermediate stage.

14. The multistage thermal flow concentration device of claim 13, further comprising:
a plurality of heat transfer pumps of a second intermediate stage, wherein each heat transfer pump of the second intermediate stage comprises a fourth electrocaloric effect material and includes a fourth heat flux that is greater than the third heat flux and less than the second heat flux; and
a plurality of thermal collection devices of the second intermediate stage, each thermal collection device of the second intermediate stage thermally coupled to a subset of the plurality of heat transfer pumps of the second intermediate stage and thermally coupled to the at least one heat transfer pump of the target stage such that the at least one heat transfer pump of the is thermally coupled indirectly to the plurality of thermal collection devices of the source stage via the first intermediate stage and the second intermediate stage.

15. The multistage thermal flow concentration device of claim 14, wherein the at least one heat transfer pump of the target stage comprises a plurality of heat transfer pumps of the target stage, each of the plurality of heat transfer pumps of the target stage thermally coupled directly to a thermal collection device of the second intermediate stage and thermally coupled directly to the heat sink.

16. The multistage thermal flow concentration device of claim 11, wherein:
- a quantity of the plurality of heat transfer pumps of the source stage is greater than a quantity of the at least one heat transfer pump of the target stage;
- the first surface area of the heat source is greater than the second surface area of the heat sink; and
- the thermal energy collected by the plurality of heat transfer pumps of the source stage thermally coupled to the first surface area of the heat source is concentrated into the second surface area of the heat sink that is thermally coupled to the at least one heat transfer pump of the target stage.

* * * * *

UNITED STATES PATENT AND TRADEMARK OFFICE
CERTIFICATE OF CORRECTION

PATENT NO. : 9,500,392 B2  
APPLICATION NO. : 13/813588  
DATED : November 22, 2016  
INVENTOR(S) : Kruglick Page 1 of 4

It is certified that error appears in the above-identified patent and that said Letters Patent is hereby corrected as shown below:

In the Drawings

In Fig. 3, Sheet 3 of 8, delete " 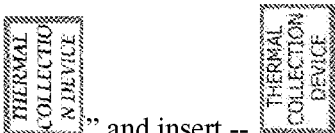 " and insert -- 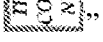 --, as shown on attached page.

In Fig. 6, Sheet 6 of 8, delete " 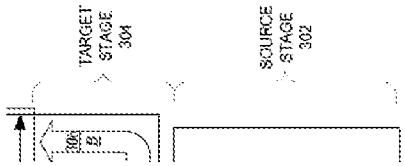 " and insert -- 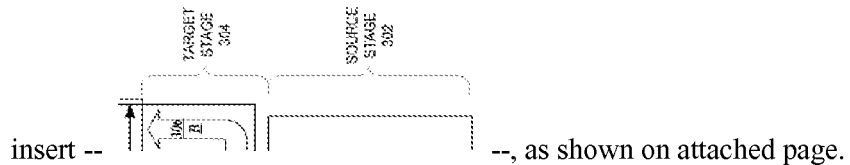 --, as shown on attached page.

In the Specification

In Column 1, Line 8, delete "§371" and insert -- § 371 --, therefor.

In Column 3, Line 34, delete "multi stage" and insert -- multistage --, therefor.

In Column 5, Line 22, delete "arc represented" and insert -- are represented --, therefor.

In Column 12, Line 4, delete "first intermediate stage 504," and insert -- first intermediate stage 502, --, therefor.

Signed and Sealed this  
Twenty-sixth Day of September, 2017

Joseph Matal  
*Performing the Functions and Duties of the*  
*Under Secretary of Commerce for Intellectual Property and*  
*Director of the United States Patent and Trademark Office*

CERTIFICATE OF CORRECTION (continued)
U.S. Pat. No. 9,500,392 B2

In Column 15, Line 11, delete "arc activated" and insert -- are activated --, therefor.

In Column 16, Line 48, delete "machine Such" and insert -- machine. Such --, therefor.

In Column 16, Line 55, delete "machine The" and insert -- machine. The --, therefor.

In Column 18, Lines 41-42, delete "thereof Any" and insert -- thereof. Any --, therefor.

In the Claims

In Column 23, Line 2, in Claim 14, delete "the is" and insert -- the target stage is --, therefor.